(12) United States Patent
Yamazaki

(10) Patent No.: US 8,163,628 B2
(45) Date of Patent: Apr. 24, 2012

(54) METHOD FOR MANUFACTURING SEMICONDUCTOR SUBSTRATE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 427 days.

(21) Appl. No.: 12/259,503

(22) Filed: Oct. 28, 2008

(65) Prior Publication Data
US 2009/0117703 A1   May 7, 2009

(30) Foreign Application Priority Data
Nov. 1, 2007   (JP) ................................ 2007-285504

(51) Int. Cl.
*H01L 21/30* (2006.01)
*H01L 21/46* (2006.01)

(52) U.S. Cl. ............................... 438/458; 257/E21.568
(58) Field of Classification Search .................. 438/458; 257/E21.568
See application file for complete search history.

(56) References Cited

U.S. PATENT DOCUMENTS

| | | | |
|---|---|---|---|
| 4,529,571 A | | 7/1985 | Bacon et al. |
| 5,223,080 A | * | 6/1993 | Ohta et al. ........................ 216/2 |
| 5,374,564 A | | 12/1994 | Bruel |
| 6,103,599 A | * | 8/2000 | Henley et al. ................. 438/459 |
| 6,127,702 A | | 10/2000 | Yamazaki et al. |
| 6,271,101 B1 | | 8/2001 | Fukunaga |
| 6,335,231 B1 | * | 1/2002 | Yamazaki et al. ............. 438/151 |
| 6,372,609 B1 | | 4/2002 | Aga et al. |
| 6,380,046 B1 | | 4/2002 | Yamazaki |
| 6,388,652 B1 | | 5/2002 | Yamazaki et al. |
| 6,468,923 B1 | | 10/2002 | Yonehara et al. |
| 6,566,158 B2 | | 5/2003 | Eriksen et al. |
| 6,576,956 B2 | | 6/2003 | Kawanaka |
| 6,602,761 B2 | | 8/2003 | Fukunaga |
| 6,613,678 B1 | * | 9/2003 | Sakaguchi et al. ............ 438/695 |
| 6,686,623 B2 | | 2/2004 | Yamazaki |
| 6,778,164 B2 | | 8/2004 | Yamazaki et al. |
| 6,803,264 B2 | | 10/2004 | Yamazaki et al. |
| 6,875,633 B2 | | 4/2005 | Fukunaga |
| 7,148,124 B1 | | 12/2006 | Usenko |
| RE39,484 E | | 2/2007 | Bruel |
| 7,176,525 B2 | | 2/2007 | Fukunaga |
| 7,199,024 B2 | | 4/2007 | Yamazaki |
| 7,256,776 B2 | | 8/2007 | Yamazaki et al. |
| 7,473,971 B2 | | 1/2009 | Yamazaki et al. |

(Continued)

FOREIGN PATENT DOCUMENTS

JP         05-211128         8/1993

(Continued)

*Primary Examiner* — Stephen W Smoot
*Assistant Examiner* — Vicki B Booker
(74) *Attorney, Agent, or Firm* — Eric J. Robinson; Robinson Intellectual Property Law Office, P.C.

(57) ABSTRACT

A method for manufacturing a semiconductor substrate is provided, which includes a step of forming a buffer layer over a first semiconductor substrate, a step of forming a damaged region in the first semiconductor substrate by irradiating the first semiconductor substrate with ions, a step of bonding the first semiconductor substrate and a second semiconductor substrate with the buffer layer interposed between, a step of separating the first semiconductor substrate with a single crystal semiconductor layer left over the second semiconductor substrate by heating the first semiconductor substrate and the second semiconductor substrate, and a step of irradiating the single crystal semiconductor layer with a laser beam and heating the single crystal semiconductor layer.

24 Claims, 14 Drawing Sheets

U.S. PATENT DOCUMENTS

| | | | |
|---|---|---|---|
| 7,476,576 B2 | 1/2009 | Yamazaki et al. |
| 7,535,053 B2 | 5/2009 | Yamazaki |
| 7,678,668 B2 | 3/2010 | Shimomura et al. |
| 7,727,846 B2 | 6/2010 | Ohnuma et al. |
| 7,781,306 B2 | 8/2010 | Kakehata |
| 7,829,434 B2 | 11/2010 | Yamazaki et al. |
| 7,910,457 B2 | 3/2011 | Yamazaki |
| 2003/0036247 A1 | 2/2003 | Eriksen et al. |
| 2004/0104424 A1 | 6/2004 | Yamazaki |
| 2005/0009252 A1 | 1/2005 | Yamazaki et al. |
| 2006/0151786 A1 | 7/2006 | Nakanishi et al. |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0281440 A1* | 12/2007 | Cites et al. | 438/458 |
| 2007/0291022 A1 | 12/2007 | Yamazaki et al. |
| 2008/0038908 A1 | 2/2008 | Henley |
| 2008/0246109 A1 | 10/2008 | Ohnuma et al. |
| 2008/0296724 A1 | 12/2008 | Yamazaki et al. |
| 2009/0004764 A1 | 1/2009 | Ohnuma et al. |
| 2010/0317161 A1 | 12/2010 | Yamazaki et al. |

FOREIGN PATENT DOCUMENTS

| | | |
|---|---|---|
| JP | 2000-012864 | 1/2000 |

* cited by examiner

| Accelerating voltage | Ratio between Model 1 and Model 5 (X : Y) | Ratio between $H^+$ and $H_3^+$ (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

FIG. 14

METHOD FOR MANUFACTURING SEMICONDUCTOR SUBSTRATE

BACKGROUND OF THE INVENTION

1. Field of the Invention

The present invention relates to a method for manufacturing a semiconductor substrate having a semiconductor layer formed over an insulating layer and a method for manufacturing a semiconductor device.

Note that a semiconductor device refers to any device which can function by utilizing semiconductor characteristics in this specification. Electro-optical devices, semiconductor circuits, and electronic devices are all semiconductor devices.

2. Description of the Related Art

In recent years, integrated circuits using a silicon on insulator (SOI) substrate, instead of using a bulk silicon wafer, have been developed. By utilizing characteristics of a thin single crystal silicon layer formed over an insulating layer, a semiconductor layer of a transistor formed in the integrated circuit can be electrically separated from each other completely. Further, since the fully depleted transistors can be formed, a semiconductor integrated circuit with high added value such as high integration, high speed driving, and low power consumption can be realized.

As an SOI substrate, a SIMOX substrate and a bonded substrate are known. For example, for an SOI structure of a SIMOX substrate, oxygen ions are implanted into a single crystal silicon substrate, heat treatment at 1300° C. or higher is conducted to form a buried oxide (BOX) layer, so that a single crystal silicon thin film is formed on the surface.

As an SOI structure of a bonded substrate, two single crystal silicon substrates (a base substrate and a bond substrate) are bonded together with an oxide film interposed therebetween, and one of the two single crystal silicon substrates (the bond substrate) is thinned on its rear side (which is not a surface to be used for bonding), so that a single crystal silicon thin film is formed. There is proposed Smart-Cut (registered trademark) employing hydrogen ion implantation (e.g., Reference 1: Japanese Published Patent Application No. H5-211128), because it is difficult to form a uniform and single crystal silicon thin film by grinding and polishing.

DISCLOSURE OF INVENTION

A summary of a method for manufacturing this SOI substrate is described. By implantation of hydrogen ions into a silicon wafer by an ion implantation method, an ion implanted layer is formed at a predetermined depth from the surface. Next, a silicon oxide film is formed by oxidizing another silicon wafer which serves as a base substrate. Then, the silicon wafer into which the hydrogen ions are implanted is bonded to the silicon oxide film of the other silicon wafer, so that the two silicon wafers are bonded. Then, through heat treatment, the silicon wafer is cleaved using the ion implanted layer as a cleavage plane, thereby forming a substrate in which a thin single crystal silicon layer is bonded to the base substrate.

An ion implantation method is also referred to as an ion introduction method, in which particles to be implanted into a sample in vacuum are ionized and accelerated by direct current or high frequency to be implanted into the sample. An ion implanter using an ion implantation method includes an ion source, a mass separation unit, an acceleration unit, a beam scanner (electrostatic scan) unit, an implantation chamber (end-station), and a vacuum evacuation unit. Further, since a cross section of an ion beam is not uniform, scanning with an ion beam is performed electrically in order to obtain uniformity of a surface of the sample. The implanted particles have a Gaussian distribution in the depth direction.

Further, Reference 2 (Japanese Published Patent Application No. 2000-012864) is known as an example of a semiconductor device using an SOI substrate. Reference 2 also discloses a technique in which hydrogen is implanted by an ion implantation method.

SUMMARY OF THE INVENTION

In order to increase production efficiency of a semiconductor device, it is expected to manufacture a semiconductor device by using a semiconductor substrate which is more than 5 inches and whose diameter is as large as possible.

An object of the present invention is to provide a method for manufacturing an SOI substrate which includes a single crystal semiconductor layer with a thin thickness and high uniformity of the thickness over an insulating film. Further, another object of the present invention is to provide a method for manufacturing a semiconductor device using the SOI substrate.

In addition, an ion implantation method is performed by raster scan with an ion beam of a given amount of current; therefore, the concentration of ions implanted into the semiconductor wafer varies. There is a risk that the cleavage plane would also become uneven reflecting the variation.

Further, an ion implantation method is performed by raster scan with an ion beam of a given amount of current; therefore, processing time per semiconductor wafer is long as the size of a semiconductor substrate is increased.

In view of the above, it is another object of the present invention to reduce processing time of a semiconductor wafer to reduce manufacturing time per SOI substrate.

In the present invention, by use of a large-diameter semiconductor substrate having 5 inches or more, for example, a 12-inch semiconductor substrate (with a diameter of about 300 mm), a semiconductor substrate with a diameter of about 400 mm, a semiconductor substrate with a diameter of about 450 mm, or a semiconductor substrate with a diameter of the above size or larger, irradiation with hydrogen ions using an ion doping method is performed, whereby manufacturing time per SOI substrate is reduced.

An ion doping method without mass separation has an advantage in that the cycle time of forming a damaged region in a single crystal semiconductor substrate can be reduced as compared to an ion implantation method with mass separation.

The ion doping apparatus has a large plasma space and can irradiate a substrate to be processed with a large amount of ions, compared to an ion implanter. For a plasma generation method, both apparatuses create a plasma state by the thermoelectrons which are emitted by heating a filament, for example. However, the ratio of hydrogen ion species when generated hydrogen ions ($H^+$, $H_2^+$, and $H_3^+$) enter a substrate in an ion doping apparatus varies greatly from that in an ion implanter. The ratio of hydrogen ion species when an ion doping apparatus is used is as follows, $H^+:H_2^+:H_3^+=1:1:8$. On the other hand, the ratio of hydrogen ion species when an ion implanter is used is as follows, $H^+:H_2^+:H_3^+=37:56:7$.

One structure of the present invention disclosed in this specification is a method for manufacturing a semiconductor substrate, including the steps of: irradiating a first single crystal semiconductor substrate with an accelerated ion by an ion doping method to form a damaged region in a region at a predetermined depth from a surface of the first single crystal semiconductor substrate; arranging a second single crystal semiconductor substrate and the first single crystal semiconductor substrate in close contact with each other with a buffer layer interposed therebetween to bond the second single crystal semiconductor substrate and the first single crystal semiconductor substrate; causing a crack in the damaged region by heating of the first single crystal semiconductor substrate and separating a part of the first single crystal semiconductor substrate from the first single crystal semiconductor substrate to form the second single crystal semiconductor substrate to which a single crystal semiconductor layer separated from the first single crystal semiconductor substrate is fixed; and while heating the single crystal semiconductor layer fixed to the second single crystal semiconductor substrate, irradiating the single crystal semiconductor layer with a laser beam and melting the single crystal semiconductor layer to undergo re-single-recrystallization of the single crystal semiconductor layer.

The present invention is to solve at least one of the above objects.

In the above structure, the buffer layer has a stacked structure including an insulating film to be bonded to one of the first single crystal semiconductor substrate and the second single crystal semiconductor substrate. Alternatively, the buffer layer has an oxide film which is formed by oxidizing one of the first single crystal semiconductor substrate and the second single crystal semiconductor substrate.

In the above structure, a diameter of the second single crystal semiconductor substrate is at least 5 inches or more, and the second single crystal semiconductor substrate is formed of a semiconductor wafer. In the case of a silicon wafer, while rotating a seed crystal that is the basis of crystal growth, the seed crystal is dipped into molten silicon in a crucible, and the seed crystal is slowly pulled upwards in an argon atmosphere by a liquid-phase Czochralski method (CZ method) to form an ingot, and then the ingot is sliced into a silicon wafer with a desired thickness by a slicer, a multi-wire saw, or the like. A compound semiconductor single crystal wafer can also be used. When a large-diameter wafer is formed, although crucible volume must be increased, a problem occurs in that the quality of an obtained single crystal is reduced because the convection of the crystal melt in the crucible increases. Therefore, a magnetic field Czochralski method (MCZ method) is also used, by which a magnetic field is applied to a silicon melt and apparent kinematic viscosity increases to control the convection of the melt. In addition, an ingot of silicon is formed by a floating zone melting method (FZ method) in some cases. The single crystal semiconductor substrate described in this specification refers not only to a silicon single crystal wafer obtained by an MCZ method, a CZ method, or an FZ method but also to a compound semiconductor single crystal substrate (GaAs, GaP, GaIn, SiGe, SiC, or the like), a silicon single crystal wafer that contains a very small amount of germanium, and a silicon single crystal wafer that contains a very small amount of boron.

Another structure of the present invention, in which a polycrystalline wafer can be used as a wafer for bonding, is a method for manufacturing a semiconductor substrate, including the steps of: irradiating a single crystal semiconductor substrate with an accelerated ion by an ion doping method to form a damaged region in a region at a predetermined depth from a surface of the single crystal semiconductor substrate; arranging a polycrystalline semiconductor substrate and the single crystal semiconductor substrate in close contact with each other with a buffer layer interposed therebetween to bond the polycrystalline semiconductor substrate and the single crystal semiconductor substrate; causing a crack in the damaged region by heating of the single crystal semiconductor substrate and separating a part of the single crystal semiconductor substrate from the single crystal semiconductor substrate to form the polycrystalline semiconductor substrate to which a single crystal semiconductor layer separated from the single crystal semiconductor substrate is fixed; and while heating the single crystal semiconductor layer fixed to the polycrystalline semiconductor substrate, irradiating the single crystal semiconductor layer with a laser beam and melting the single crystal semiconductor layer to undergo re-single-recrystallization of the single crystal semiconductor layer.

In the above structure, the buffer layer has a stacked structure including an insulating film to be bonded to one of the single crystal semiconductor substrate and the polycrystalline semiconductor substrate. Alternatively, the buffer layer has a stacked structure including an oxide film obtained by oxidizing one of the single crystal semiconductor substrate and the polycrystalline semiconductor substrate.

In the above structure, a diameter of the polycrystalline semiconductor substrate is at least 5 inches or more, and the polycrystalline semiconductor substrate is formed of a wafer. The polycrystalline semiconductor substrate described in this specification refers not only to a silicon polycrystalline wafer but also to a compound semiconductor polycrystalline substrate, a silicon polycrystalline wafer that contains a very small amount of germanium, and a silicon polycrystalline wafer that contains a very small amount of boron.

In each of the above structure, the buffer layer has a stacked structure including one of a silicon nitride film and a silicon nitride oxide film. When a silicon nitride film or a silicon nitride oxide film is used as one layer of the buffer layer, lattice distortion in Si generated by the silicon nitride film or the silicon nitride oxide film is used, whereby a high electron mobility transistor can be formed.

In each of the above structure, the buffer layer has a stacked structure including an insulating film which is arranged in close contact with the single crystal semiconductor layer, and the insulating film contains a halogen such as chlorine, fluorine, or the like. When a halogen is contained in the insulating film that is in contact with the single crystal semiconductor layer, the insulating film is also heated at the time of heat treatment at 500° C. to 1100° C. or at the time of irradiation with a laser beam. Accordingly, the halogen is diffused from the insulating film, whereby the halogen can be segregated at the interface between the single crystal semiconductor layer and the insulating film. The halogen is segregated at the interface between the single crystal semiconductor layer and the insulating film, whereby impurity ions such as sodium or the like which exists at the interface can be captured by the halogen. Therefore, it is very effective to form an insulating film that contains a halogen for preventing contamination of impurities such as sodium or the like.

In each of the above structure, polishing such as chemical mechanical polishing or the like or grinding is performed on the surface of the single crystal semiconductor layer, whereby the surface planarity of the single crystal semiconductor layer may be improved or the thickness of the single crystal semiconductor layer may be thin. Note that chemical mechanical polishing (abbreviation: CMP) is treatment for planarizing a surface by polishing chemically or mechanically using slurry in which an alkaline solution and polishing abrasive grains are mixed.

In each of the above structure, heating temperature of the single crystal semiconductor layer at the time of irradiation with the laser beam is higher than or equal to 500° C. and lower than or equal to 1100° C. The heating of the single crystal semiconductor layer is performed by a heating means included in a stage, spraying a heated gas, or lamp irradiation.

In each of the above structure, a shape of a top surface of a region irradiated with the laser beam is one of a linear shape, a square, and a rectangle. The length of the region irradiated with the laser beam is longer than a diameter of a semiconductor wafer to be irradiated, and the stage that fixes the semiconductor wafer is moved in one direction, whereby laser irradiation is performed over the entire surface of the semiconductor wafer.

Here, the single crystal means a crystal in which, when a certain crystal axis is focused on, the direction of the crystal axis is oriented in the same direction in any portion of a sample and which has no crystal grain boundary between crystals. Note that, in this specification, the single crystal includes a crystal in which crystal axes are uniformly oriented as described above and which has no grain boundary even when including a crystal defect or a dangling bond. In addition, re-single-crystallization of a single crystal semiconductor layer means that a semiconductor layer having a single crystal structure returns to a single crystal structure after being in a different state from the single crystal structure (e.g., a liquid-phase state). Alternatively, it can be said that re-single-crystallization of a single crystal semiconductor layer means that a single crystal semiconductor layer is recrystallized to form a single crystal semiconductor layer.

By use of an ion doping apparatus, irradiation time with hydrogen ions can be reduced and manufacturing time per SOI substrate can be reduced, compared with a conventional method for manufacturing an SOI substrate by using an ion implantation method.

BRIEF DESCRIPTION OF THE DRAWINGS

FIG. 14 is a diagram which summarizes the fitting parameter ratio (hydrogen element ratio and the hydrogen ion species ratio).

DETAILED DESCRIPTION OF THE INVENTION

Embodiment Mode

Figure 1A:
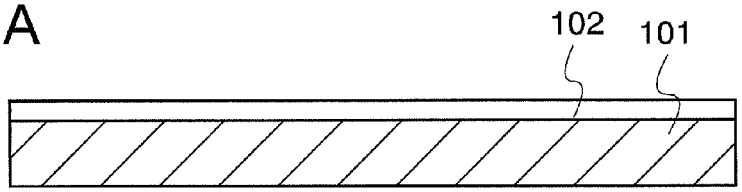
FIGS. 1A to 1E are diagrams illustrating a manufacturing process of a semiconductor substrate.

Embodiment modes of the present invention will be hereinafter described.

Embodiment Mode 1

A method for manufacturing an SOI substrate will be described hereinafter with reference to FIGS. 1A to 1E. First, a buffer layer 102 is formed over a first semiconductor wafer 101.

Here, a 12-inch single crystal silicon wafer (a diameter of about 300 mm) whose crystal orientation is (100) is used for the first semiconductor wafer 101, as an example.

As a circular single crystal semiconductor wafer, a semiconductor wafer of silicon or germanium; a compound semiconductor wafer of gallium arsenide or indium phosphide; or the like can be used. Needless to say, the single crystal semiconductor substrate is not limited to a circular wafer, and various shapes of single crystal semiconductor substrates can be used. For example, a polygonal substrate such as a circular substrate, a rectangular substrate, a pentagonal substrate, a hexagonal substrate, or the like can be used.

In addition, a rectangular single crystal semiconductor substrate can be formed by cutting a commercial circular single crystal semiconductor wafer. The substrate can be cut with a cutting apparatus such as a dicer or a wiresaw, a laser, plasma, an electronic beam, or any other cutting means. In addition, a rectangular single crystal semiconductor substrate can be formed in such a way that an ingot for manufacturing a semiconductor substrate before being sliced into a substrate is processed into a rectangular solid so as to have a rectangular cross section and this rectangular solid ingot is sliced. In addition, although there is no particular limitation on the thickness of the single crystal semiconductor substrate, a thicker single crystal semiconductor substrate is preferable because many single crystal semiconductor layers can be formed from one piece of thick material wafer, in consideration of reuse of the single crystal semiconductor substrate. The thickness of single crystal silicon wafers circulating in the market conforms to SEMI standards, which specify that, for example, a wafer with a diameter of 6 inches has a thickness of 625 μm, a wafer with a diameter of 8 inches has a thickness of 725 μm, and a wafer with a diameter of 12 inches has a thickness of 775 μm. Note that the thickness of a wafer conforming to SEMI standards has a tolerance of ±25 μm. Needless to say, the thickness of the material wafer is not limited to SEMI standards, and the thickness can be adjusted as appropriate when an ingot is sliced. Naturally, when a reprocessed single crystal semiconductor substrate is used, the thickness thereof is thinner than that of SEMI standards.

The buffer layer 102 can be formed with a single film or two or more films. The buffer layer 102 can include an insulating film containing silicon or germanium in its composition, such as a silicon oxide film, a silicon oxynitride film, a silicon nitride oxide film, a silicon nitride film, a germanium oxide film, a germanium nitride film, a germanium oxynitride film, or a germanium nitride oxide film by a PECVD method or a sputtering method if sufficient planarity can be obtained. Alternatively, as the buffer layer 102, a silicon oxide film can be formed by a PECVD method with the use of an organosilane gas and oxygen as a process gas. Further alternatively, a thermal oxide film obtained by thermal oxidation can be used. Note that the thermal oxide film obtained by thermal oxidation is formed on a front surface and a rear surface of the wafer and a surface including an end face.

Further, an insulating film including metal oxide such as aluminum oxide, tantalum oxide, or hafnium oxide; an insulating film including metal nitride such as aluminum nitride; an insulating film including metal oxynitride such as an aluminum oxynitride film; or an insulating film including metal nitride oxide such as an aluminum nitride oxide film can also be used as the buffer layer 102.

In this specification, the oxynitride refers to a substance which contains more oxygen atoms than nitrogen atoms as the composition; whereas the nitride oxide refers to a substance which contains more nitrogen atoms than oxygen atoms as the composition. For example, silicon oxynitride means a substance that includes oxygen, nitrogen, silicon, and hydrogen at concentrations ranging from 55 at. % to 65 at. %, 1 at. % to 20 at. %, 25 at. % to 35 at. %, and 0.1 at. % to 10 at. %, respectively. Further, silicon nitride oxide means a substance that includes oxygen, nitrogen, silicon, and hydrogen at concentrations ranging from 15 at. % to 30 at. %, 20 at. % to 35 at. %, 25 at. % to 35 at. %, and 15 at. % to 25 at. %, respectively.

In this embodiment mode, as the buffer layer 102, a two-layer structure is used in which a silicon nitride film (with a thickness of 50 nm) obtained by a PECVD method is stacked over a silicon oxide film (with a thickness of 100 nm) obtained by a PECVD method. Note that it is undesirable to form a silicon nitride film in contact with the first semiconductor wafer 101 in terms of characteristics of a transistor to be formed later; therefore, a silicon oxide film is provided between the silicon nitride film and the first semiconductor wafer 101. Alternatively, the silicon nitride film may be replaced with a silicon nitride oxide film.

When nitride oxide such as a silicon nitride film, a silicon nitride oxide film, or the like is used as at least one layer of the buffer layer 102, a high electron mobility transistor can be formed over the buffer layer 102 using lattice distortion in Si generated by the film stress of the buffer layer 102.

A cross-sectional process view of the steps so far corresponds to FIG. 1A.

Next, the first semiconductor wafer 101 is irradiated with $H_3^+$ ions through the buffer layer 102 by an ion doping apparatus. A condition of this doping is set as follows: the power output of 100 W; the accelerating voltage of 35 kV; and the dose of $2.2 \times 10^{16}$ ions/cm$^2$. The ion doping apparatus rotates the first semiconductor wafer 101 to obtain uniform distribution of ions. A damaged region 103 containing a large amount of hydrogen is formed by irradiation with the $H_3^+$ ions. A single crystal semiconductor layer 104 is formed between the damaged region 103 and the buffer layer 102. A cross-sectional process view of the steps so far corresponds to FIG. 1B. The thickness of the single crystal semiconductor layer 104 is determined by the position in the depth direction of the damaged region 103. Therefore, the thickness of the single crystal semiconductor layer 104 depends on a doping condition (accelerating voltage or the like) of $H_3^+$ ions. With a high proportion of $H_3^+$ ions to the total hydrogen ion species used for irradiation, efficiency can be increased and irradiation time can be shortened.

Next, the first semiconductor wafer 101 provided with the buffer layer 102 is subjected to ultrasonic cleaning in pure water.

Next, after cleaning a surface of the buffer layer 102, the buffer layer 102 is arranged in close contact with one surface of a second semiconductor wafer 105, so that the first semiconductor wafer 101 and the second semiconductor wafer 105 are superposed and bonded. Note that the surface of the second semiconductor wafer 105 which is to be bonded is sufficiently cleaned in advance. When the first semiconductor wafer 101 and the second semiconductor wafer 105 are superposed and at least one portion is lightly pressed from the external, distance between the surfaces to be bonded is locally decreased; therefore, van der Waals forces get stronger, and hydrogen bonding further contributes to attraction between the first semiconductor wafer 101 and the second semiconductor wafer 105 and bonding therebetween. Further, even in the neighboring regions, the distance between the opposed substrates is reduced; thus, a region on which van der Waals forces strongly act or a region affected by hydrogen bonding spreads, the bonding is promoted and spreads throughout the entire bonding surface.

Before a surface where the buffer layer of the first semiconductor wafer 101 is formed and one surface of the second semiconductor wafer 105 are arranged in close contact with each other, the surfaces may be washed with pure water containing ozone.

Before the surface where the buffer layer of the first semiconductor wafer 101 is formed and one surface of the second semiconductor wafer 105 are arranged in close contact with each other, another insulating film to serve as one layer of the buffer layer may be formed over the first semiconductor wafer 101. In addition, before the surface where the buffer layer of the first semiconductor wafer 101 is formed and one surface of the second semiconductor wafer 105 are arranged in close contact with each other, another insulating film to serve as one layer of the buffer layer may be formed over the second semiconductor wafer 105.

After the first semiconductor wafer 101 and the second semiconductor wafer 105 are bonded together with the buffer layer 102 interposed therebetween, heat treatment or pressure treatment is preferably performed. Heat treatment or pressure treatment makes it possible to increase bonding strength. The heating temperature here is set at temperatures at which elements or molecules added in the damaged region 103 are not separated out; specifically, the temperatures are preferably 350° C. or lower. In other words, the damaged region 103 does not release gas within this heating temperature range. Pressure treatment is performed so that pressure is applied in the direction perpendicular to the bonding surface, considering resistance to pressure of the first semiconductor wafer 101 and the second semiconductor wafer 105.

Figure 1B:
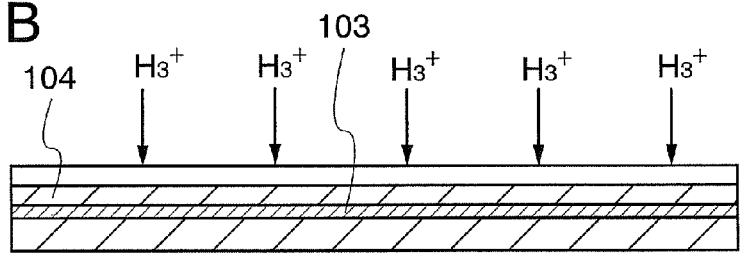
Figure 1C:
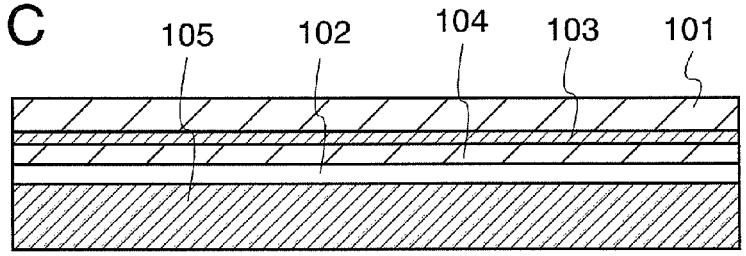

A cross-sectional process view of the steps so far corresponds to FIG. 1C.

Next, when the heat treatment is performed at 400° C. to 600° C., the volume of microvoids formed in the damaged region 103 is changed, so that a cleavage can be created inside the damaged region 103. Further, heat treatment here increases the bonding strength of the bonding layer. Heat treatment can be performed using a furnace for heating or by irradiation with a laser beam. For heat treatment here, a rapid thermal anneal (RTA) apparatus, a resistance heating furnace, or a microwave heating apparatus can be used. In the RTA apparatus, a gas rapid thermal anneal (GRTA) apparatus or a lamp rapid thermal anneal (LRTA) apparatus can be used. It is preferable that, by this heat treatment, the temperature of the second semiconductor wafer 105 to which the single crystal semiconductor layer 104 is bonded be increased in the range of higher than or equal to 550° C. and lower than or equal to 650° C.

In this embodiment mode, heat treatment by using a vertical furnace having resistance heating is performed. The second semiconductor wafer 105 to which the first semiconductor wafer 101 is bonded is loaded into a boat for the vertical furnace. The boat is carried into a chamber of the vertical furnace. In order to suppress oxidation of the first semiconductor wafer 101, the chamber is first exhausted to a vacuum state. The degree of vacuum is about $5 \times 10^{-3}$ Pa. After a vacuum state is obtained, nitrogen is supplied to the chamber so that the chamber has a nitrogen atmosphere under atmospheric pressure. In this period, the temperature is increased to 200° C.

After the chamber is made to have a nitrogen atmosphere under atmospheric pressure, heating is performed at 200° C. for two hours. Then, the temperature is increased to 400° C. for one hour. After a state in which the heating temperature is 400° C. becomes stable, the temperature is increased to 600° C. for one hour. After a state in which the heating temperature is 600° C. becomes stable, heat treatment is performed at 600° C. for two hours. Then, heating temperature is decreased to 400° C. for one hour, and after 10 minutes to 30 minutes, the boat is carried out from the chamber. Under the atmosphere, the first semiconductor wafer 101 and the second semiconductor wafer 105 to which the first semiconductor wafer 101 is bonded are cooled on the boat.

In the above-mentioned heat treatment using a resistance heating furnace, heat treatment to increase bonding force between the first semiconductor wafer 101 and the second semiconductor wafer 105, and heat treatment to cause separation in the damaged region 103 are performed in succession. In the case of performing these two heat treatments in different apparatuses, for example, heat treatment is performed at 200° C. for two hours in a resistance heating furnace, and then the second semiconductor wafer 105 and the first semiconductor wafer 101 which are bonded together are carried out from the furnace. Next, heat treatment is performed at temperature higher than or equal to 600° C. and lower than or equal to 700° C. for 1 minute to 30 minutes with an RTA apparatus, so that the first semiconductor wafer 101 is separated in the damaged region 103.

In order to strongly bond the first semiconductor wafer 101 and the second semiconductor wafer 105 to each other by low temperature treatment at 700° C. or lower, it is preferable that OH groups or water molecules ($H_2O$) exist on the surface of the buffer layer 102 and the surface of the supporting substrate. This is because the buffer layer 102 and the second semiconductor wafer 105 starts from the formation of covalent bonds (covalent bonds of oxygen molecules and hydrogen molecules) or hydrogen bonds of the OH groups or the water molecules.

Figure 1D:
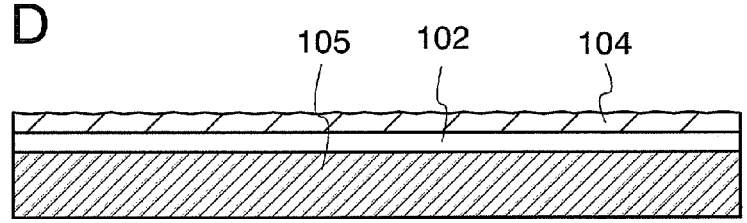

Through the above steps, the SOI substrate shown in FIG. 1D can be obtained. The SOI substrate shown in FIG. 1D has the buffer layer 102 over the second semiconductor wafer 105, and the single crystal semiconductor layer 104 over the buffer layer 102.

In the single crystal semiconductor layer 104 in the state shown in FIG. 1D, crystallinity is lost by the formation of the damaged region 103, the cleavage in the damaged region 103, and the like. That is, the single crystal semiconductor layer 104 is provided with crystal defects such as dislocation or the like which does not exist in the first semiconductor wafer 101 before processing or crystal micro defects such as dangling bonds or the like. In addition, the surface of the single crystal semiconductor layer 104 is a separation plane at which the single crystal semiconductor layer 104 is separated from the first semiconductor wafer 101, and planarity is lost. Note that the planarity of the surface of the single crystal semiconductor layer can be measured by observation by an atomic force microscope or the like. The planarity of the single crystal semiconductor layer 104 in the state shown in FIG. 1D is as follows: the arithmetical mean roughness Ra is about 8 nm; the root-mean-square roughness RMS is about 11 nm; and the maximum difference in height P-V is about 150 nm or more.

Next, treatment for improving planarity or recovering crystallinity of the single crystal semiconductor layer 104 is performed. As treatment for improving planarity, chemical mechanical polishing (abbreviation: CMP) or laser beam irradiation is performed.

When CMP is performed to improve planarity of the single crystal semiconductor layer 104, after CMP is performed, slurry or the like to be used in the CMP process is washed, and then, heat treatment is performed at 500° C. to 1100° C. to recover the crystallinity. The heat treatment at 500° C. to 1100° C. can be performed by using an RTA apparatus, a resistance heating furnace, or a microwave heating apparatus. As the RTA apparatus, a GRTA apparatus, or an LRTA apparatus can be used. In addition, after heat treatment at 500° C. to 1100° C. is performed in advance to recover crystallinity, CMP may be performed.

When a laser beam is delivered to improve planarity of the single crystal semiconductor layer 104, planarity can be improved and crystallinity can be recovered. By irradiation with a laser beam, the planarity of the single crystal semiconductor layer 124 can be set as follows: the arithmetical mean roughness Ra is about 2 nm or less; the root-mean-square roughness RMS is about 2 nm or less, the maximum difference in height P-V is about 25 nm or less. In addition, the crystallinity of the single crystal semiconductor layer 104 which has been subjected to a laser irradiation process is improved more than the single crystal semiconductor layer before laser irradiation. Note that the crystallinity of the single crystal semiconductor layer can be evaluated by observation with an optical microscope, Raman shift and a full width at half maximum which are obtained from a Raman spectroscopy spectrum, or the like.

Figure 1E:
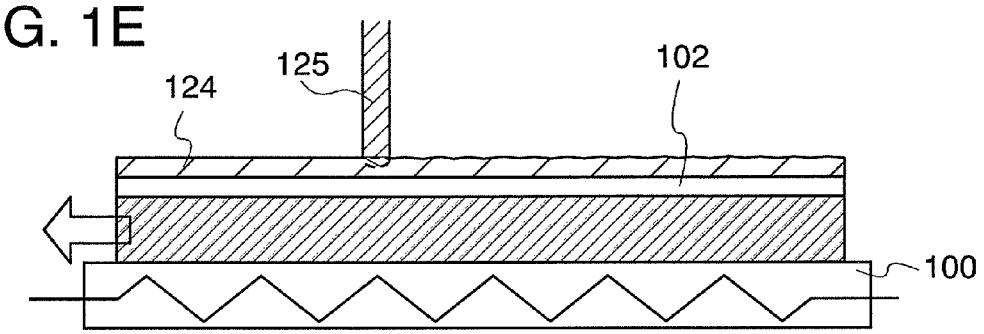

Here, as shown in FIG. 1E, a heater is incorporated into a movable stage 100 and the second semiconductor wafer 105 is moved while the second semiconductor wafer 105 is heated at 500° C. to 1100° C., whereby the surface of the single crystal semiconductor layer 104 is irradiated with a laser beam 125; thus, an SOI substrate having the single crystal semiconductor layer 124 with improved planarity can be formed. After laser irradiation, it is preferable that the single crystal semiconductor layer 124 be subjected to heat treatment at higher than or equal to 500° C. and lower than or equal to 1100° C. By this heat treatment, a defect of the single crystal semiconductor layer 124, which has not been repaired by irradiation with a laser beam, can be eliminated, and the distortion of the single crystal semiconductor layer 124, which has not been recovered by irradiation with a laser beam, can be eased. This heat treatment can be performed by using an RTA apparatus, a resistance heating furnace, or a microwave heating apparatus. As the RTA apparatus, a GRTA apparatus or an LRTA apparatus can be used.

Note that it is preferable to perform an etching process before irradiation with the laser beam 125. It is preferable to remove the damaged region 103 remaining on the separation plane of the single crystal semiconductor layer 104 by this etching process. By removing the damaged region 103, an effect of surface planarization and an effect of re-single-crystallization can be enhanced by irradiation with the laser beam 125.

This etching can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a tetramethylammonium hydroxide (abbreviation: TMAH) solution.

When the laser beam 125 is delivered, the single crystal semiconductor layer 104 absorbs the laser beam 125, and the temperature of the portion irradiated with the laser beam 125 is increased. When the temperature of this portion is more than or equal to the melting point of the single crystal semiconductor layer 104, this portion is melted. The stage 100 moves, whereby the region irradiated with the laser beam 125 moves. Accordingly, when the temperature of the melted portion of the single crystal semiconductor layer 104 is decreased to the temperature of less than or equal to its melting point, this melted portion is solidified and re-single-crystallization is undergone. While the laser beam 125 is delivered and the single crystal semiconductor layer 104 is melted, the laser beam 125 is scanned and the entire surface of the single crystal semiconductor layer is irradiated with the laser beam.

By irradiation with the laser beam 125, the region of the single crystal semiconductor layer 104, which is irradiated with the laser beam 125, is partly melted. To be a state where the single crystal semiconductor layer 104 is partly melted indicates that the depth of the melted portion of the single crystal semiconductor layer 104 is shallower than the interface between the buffer layer 102 and the single crystal semiconductor layer 104 (the thickness of the single crystal semiconductor layer 104). That is, the state where the single crystal semiconductor layer 104 is partly melted indicates that the upper layer of the single crystal semiconductor layer 104 is melted and is in a liquid phase and a lower layer thereof is a solid-phase single crystal semiconductor without melting.

When the single crystal semiconductor layer 104 is partly melted by irradiation with the laser beam 125 to solidify the melted portion, crystal growth occurs from the single crystal semiconductor which is the solid-phase portion without melting in the lower layer, and a so-called longitudinal growth occurs. The solid-phase portion in the lower layer is a single crystal and crystal orientation is uniform; therefore, no crystal grain boundary is formed and the single crystal semiconductor layer 124 after a laser irradiation process can be made a single crystal semiconductor layer without a crystal grain boundary. Although the melted upper layer is solidified to undergo re-single-crystallization, a single crystal semiconductor which has uniform crystal orientation of the single crystal semiconductor in the solid-phase portion in the lower layer is formed. Accordingly, when a single crystal silicon wafer having a (100) plane of its major surface is used as the first semiconductor wafer 101, the major surface of the single crystal semiconductor layer 104 is a (100) plane, and the major surface of the single crystal semiconductor layer 124 which is partly melted by a laser irradiation process and in which re-single-crystallization is undergone is a (100) plane.

The single crystal semiconductor layer 104 is partly melted by irradiation with the laser beam 125, whereby the single crystal semiconductor layer 124 with a flat surface can be formed. This is because the portion where the single crystal semiconductor layer is melted by irradiation with the laser beam is liquid; therefore, the surface area is transformed to be minimized by operation of surface tension. That is, in order that the liquid portion is transformed so as not to have a depression portion and a projection portion and this liquid portion is solidified to undergo re-single-crystallization, the single crystal semiconductor layer 124 with planarized surface can be formed.

In irradiation with the laser beam 125, heating at 500° C. to 1100° C. has advantages in that at least the period of time when the single crystal semiconductor layer is melted can be increased and that the energy of the laser beam that is needed for melting of the single crystal semiconductor layer can be reduced by heating a laser beam irradiation region in advance. If the cooling rate of the melted single crystal semiconductor layer can be reduced, compared with natural cooling, re-single-crystallization is undergone smoothly by an increase in melting time, and a single crystal semiconductor layer without a grain boundary can be obtained.

When a laser beam is delivered at room temperature, although melting time is about 100 nanoseconds or less, the melting time can be increased to 100 nanoseconds or more by heating the single crystal semiconductor layer with a heating means of the stage, and for example, the melting time can be 200 nanoseconds or more.

By an increase in melting time, a single crystal semiconductor layer can be irradiated with a laser beam before the single crystal semiconductor layer is solidified after it is melted by being irradiated with the previous laser beam. Therefore, the number of shots can be reduced. Even when the number of shots is reduced, sufficient planarization can be achieved. In addition, a reduction in the number of shots contributes to an improvement in productivity. In scanning with a laser beam, the percentage of overlap of one shot with the subsequent shot is also referred to as overlap percentage. By an increase in melting time, the overlap percentage can be reduced to about one-tenth, and can also be reduced to 0%. In addition, if energy of the laser beam which is needed for melting of the single crystal semiconductor layer can be reduced, an area irradiated with one shot can be expanded by adjusting the optical system or the like. If the area irradiated with one shot can be expanded, the length of time needed for a laser process per one piece can be reduced.

In particular, when a large-diameter wafer (a 12-inch single crystal silicon wafer (a diameter of about 300 mm)) is used as in this embodiment mode, to enlarge an area that is irradiated with one shot and to reduce processing time have advantageous effects.

As a laser that emits the laser beam 125, a laser whose emission wavelength ranges from ultraviolet light to visible light is selected. The wavelength of the laser beam 125 is a wavelength absorbed by the single crystal semiconductor layer 104. The wavelength can be determined in consideration of the skin depth of the laser beam, and the like. For example, the wavelength can be in the range of greater than or equal to 250 nm and less than or equal to 700 nm.

As this laser, a continuous wave laser, a quasi continuous wave laser, or a pulsed laser can be used. A pulsed laser is preferable for partial melting. In the case of a pulsed laser, a repetition rate can be set at 1 MHz or less and a pulse width can be set at greater than or equal to 10 nanoseconds and less than or equal to 500 nanoseconds. A typical pulsed laser is an excimer laser that emits a beam having a wavelength of 400 nm or less. As a laser, a XeCl excimer laser with a repetition rate of 10 Hz to 300 Hz, a pulse width of 25 nanoseconds, and a wavelength of 308 nm can be used, for example.

The energy of the laser beam 125 can be determined in consideration of the wavelength of the laser beam 125, the skin depth of the laser beam 125, the thickness of the single crystal semiconductor layer 104, and the like. The energy of the laser beam 125 can be set, for example, in the range of 300 mJ/cm$^2$ to 800 mJ/cm$^2$ both inclusive. For example, in the case where the thickness of the single crystal semiconductor layer 104 is about 120 nm, a pulsed laser is used as a laser, and a wavelength of the laser beam 125 is 308 nm, the energy density of the laser beam 125 can be set at 600 mJ/cm² to 700 mJ/cm².

It is confirmed that the atmosphere of irradiation with the laser beam 125 has an effect of planarizing the single crystal semiconductor layer 104, in either of the atmosphere that does not control the atmosphere or the nitrogen gas atmosphere with a small amount of oxygen. It is also confirmed that the nitrogen gas atmosphere is more preferable than the atmosphere. The nitrogen atmosphere and a vacuum state have higher effects of improving planarity of the single crystal semiconductor layer 104 than the atmosphere and have higher effects of suppressing generation of cracks than the atmosphere. Accordingly, the applicable energy range for the laser beam 125 is widened.

It is preferable that atmosphere surrounding a semiconductor wafer when a laser beam is delivered be the nitrogen gas atmosphere where oxygen and moisture are reduced as small as possible. It is preferable that the oxygen concentration included in the nitrogen gas atmosphere be 30 ppm or less, preferably, 30 ppb or less. More preferably, it is preferable that moisture ($H_2O$) concentration included in the nitrogen gas atmosphere be 30 ppm or less. Desirably, the oxygen concentration included in the nitrogen gas atmosphere is 30 ppb or less and moisture concentration is 30 ppb or less.

In the nitrogen gas atmosphere, while a nitrogen gas that is heated at 500° C. to 1100° C. is sprayed on a laser beam irradiation region, the laser beam is delivered, whereby the surface temperature of the single crystal semiconductor layer 104 can be kept high. Needless to say, it is preferable to use a high-purity nitrogen gas for a nitrogen gas to be sprayed, and it is preferable that the oxygen concentration included in the nitrogen gas be 30 ppm or less, preferably, 30 ppb or less. In the case of laser irradiation, an oxygen element included in the nitrogen atmosphere and the nitrogen gas to be sprayed is reduced as small as possible, whereby an oxide film is prevented from being formed by laser irradiation on the surface of the single crystal semiconductor layer.

Although the number of steps is increased, after heat treatment is performed at 500° C. to 1100° C., a laser beam is delivered at room temperature and CMP can be further performed. Although the number of steps is increased, after heat treatment is performed at 500° C. to 1100° C., a laser beam is delivered while heating is performed at 500° C. to 1100° C., and CMP can be further performed. Although the number of steps is increased, after a laser beam is delivered at room temperature and heat treatment is performed at 500° C. to 1100° C., CMP can be further performed. Although the number of steps is increased, a laser beam is delivered while heating is performed at 500° C. to 1100° C. and heat treatment is performed at 500° C. to 1100° C., and then CMP can be further performed.

Although the number of the steps is increased, an etching process, thermal oxidation process, or a CMP process may be performed in order to reduce the thickness of the single crystal semiconductor layer 124. The thickness of the single crystal semiconductor layer 124 can be determined in accordance with characteristics of an element formed from the single crystal semiconductor layer 124. In order to form a thin gate insulating layer with favorable step coverage on the surface of the single crystal semiconductor layer 124 that is bonded to the second semiconductor wafer 105, it is preferable that the thickness of the single crystal semiconductor layer 124 be 50 nm or less, and the thickness thereof may be more than or equal to 5 nm and less than 50 nm.

In the case of a step of FIG. 1B, an ion irradiation method by using an ion doping apparatus is described.

In the present invention, a single crystal semiconductor substrate is irradiated with ions that are derived from hydrogen (H) (hereafter referred to as "hydrogen ion species"). More specifically, a hydrogen gas or a gas which contains hydrogen in its composition is used as a source material; hydrogen plasma is generated; and the single crystal semiconductor substrate is irradiated with the hydrogen ion species in the hydrogen plasma.

(Ions in Hydrogen Plasma)

In such hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \qquad (1)$$

$$e + H_2 \rightarrow e + H_2^+ + e \qquad (2)$$

$$e + H_2 \rightarrow e + (H_2)^* \rightarrow e + H + H \qquad (3)$$

$$e + H_2^+ \rightarrow e + (H_2^+)^* \rightarrow e + H^+ + H \qquad (4)$$

$$H_2^+ + H_2 \rightarrow H_3^+ + H \qquad (5)$$

$$H_2^+ + H_2 \rightarrow H^+ + H + H_2 \qquad (6)$$

$$e + H_3^+ \rightarrow e + H^+ + H + H \qquad (7)$$

$$e + H_3^+ \rightarrow H_2 + H \qquad (8)$$

$$e + H_3^+ \rightarrow H + H + H \qquad (9)$$

Figure 3:
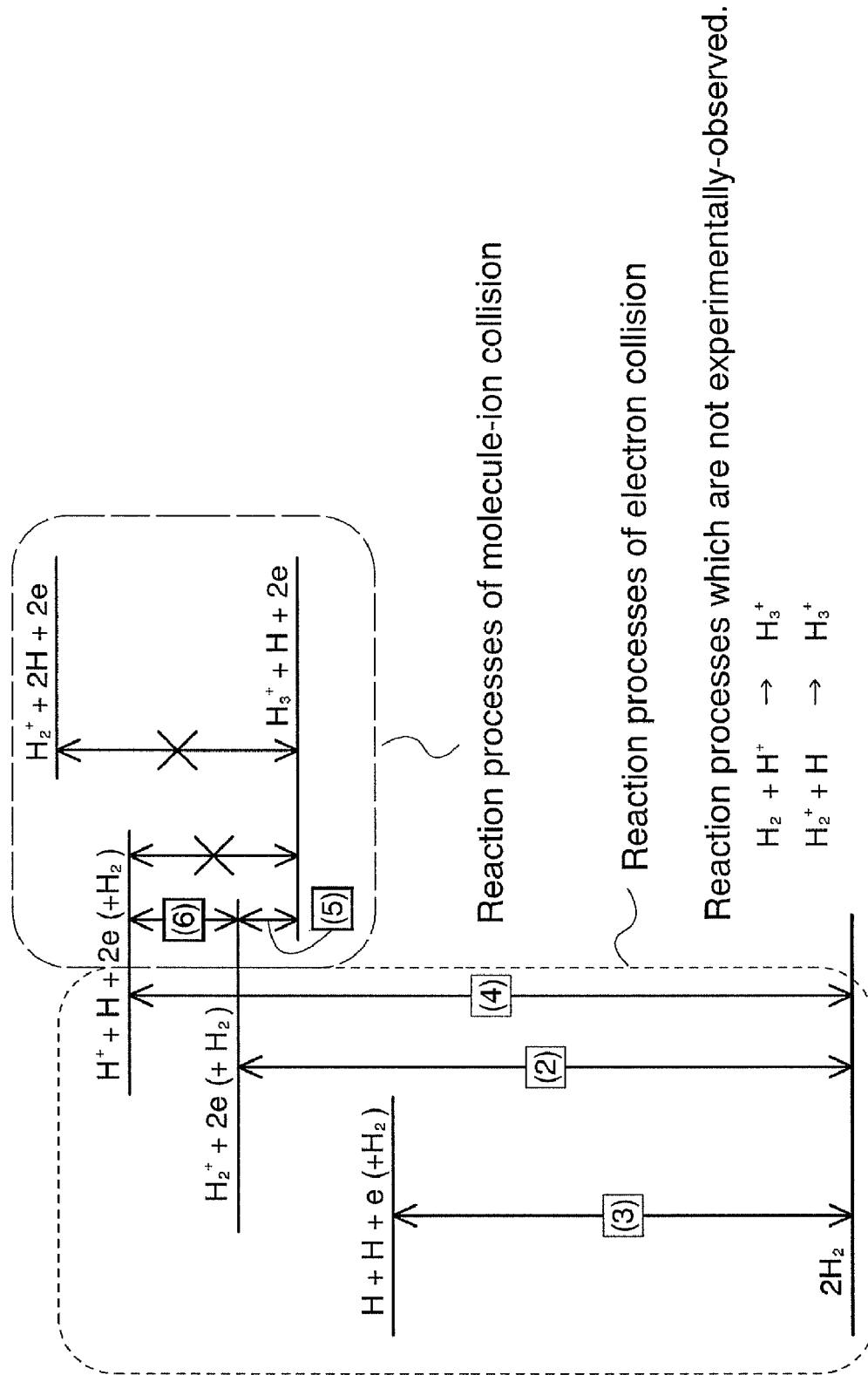
FIG. 3 is an energy diagram of hydrogen ion species.

FIG. 3 is an energy diagram which schematically shows some of the above reactions. Note that the energy diagram shown in FIG. 3 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that, because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to a potential energy lost by transfer of the charged particle. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a large amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation in which the electric field is high, the amount of $H_3^+$ tends to be decreased, and because the reaction of the reaction equation (5) is the main reaction in a situation in which the electric field is low, the amount of $H_3^+$ tends to be increased.

(Differences Depending on Ion Source)

Figure 2:
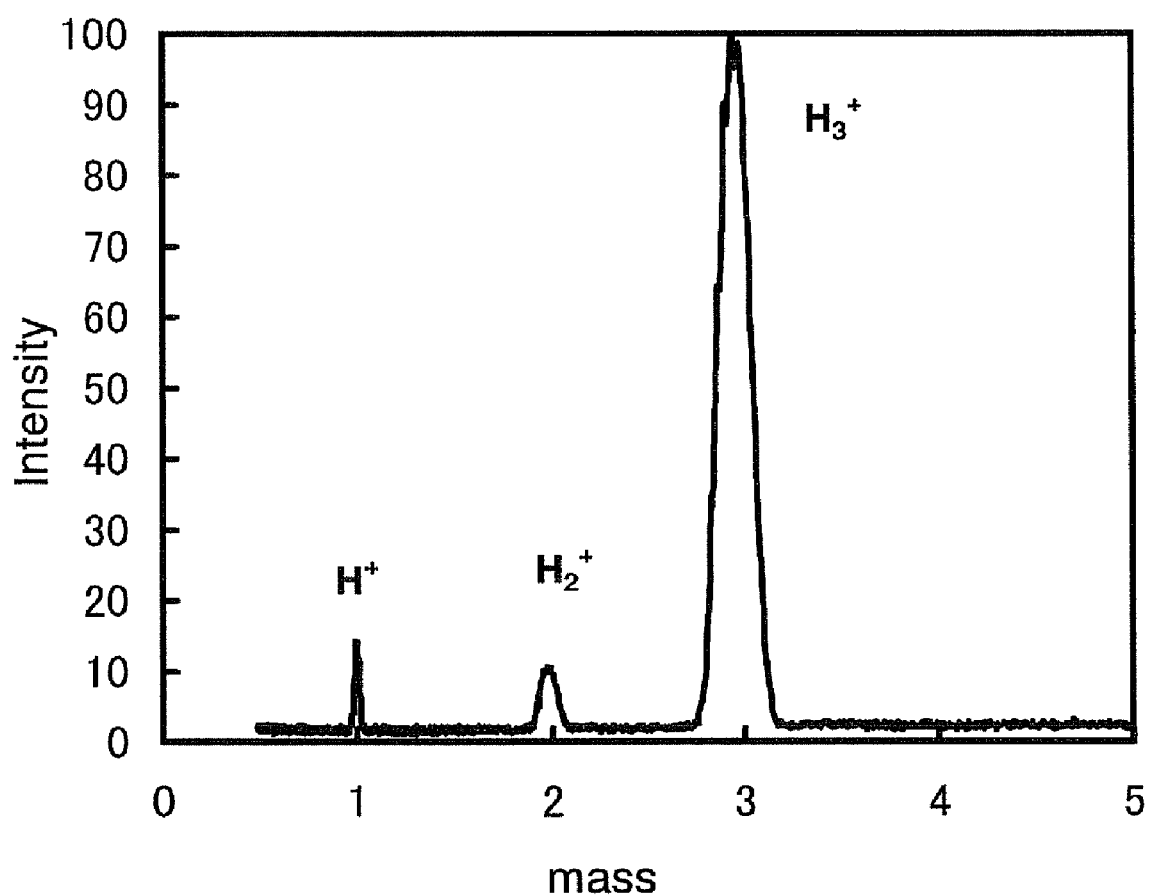
FIG. 2 is a result of mass spectrometry of ion species generated in an ion doping apparatus.

Here, an example in which the proportions of ion species (particularly, the proportion of $H_3^+$) are different is described. FIG. 2 is a graph illustrating the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$, $H_2^+$, and $H_3^+$, respectively. The vertical axis represents the intensity of the spectrum, which corresponds to the number of ions. In FIG. 2, the number of ions with different masses is expressed as a relative proportion where the number of ions with a mass of 3 is defined as 100. It can be seen from FIG. 2 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates plasma, an extraction electrode that extracts an ion beam from the plasma, and the like.

Figure 10:
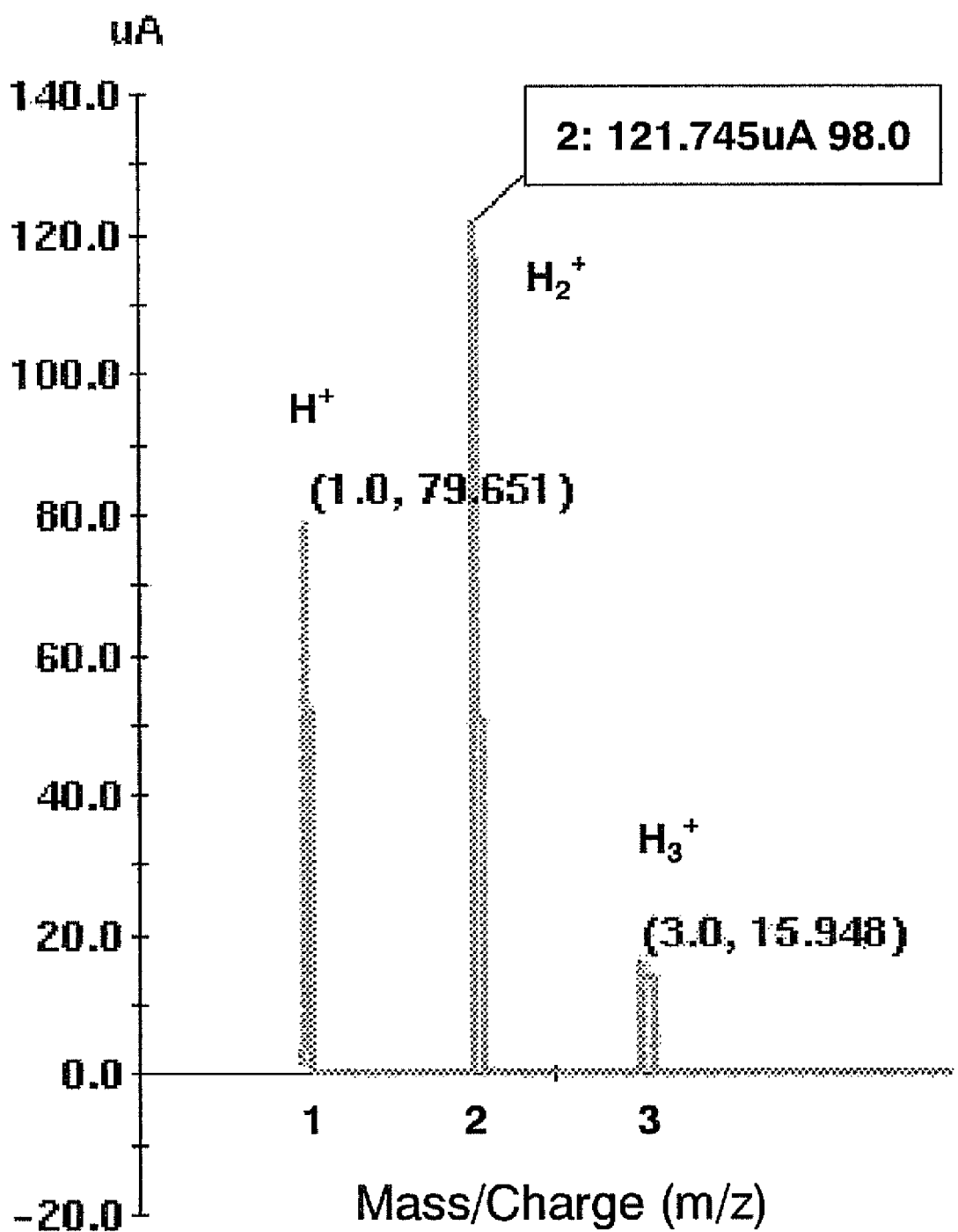
FIG. 10 is a result of mass spectrometry of ion species generated in an ion implanter.

FIG. 10 is a graph showing the results of mass spectrometry of ions that are generated from $PH_3$ when an ion source different from that for the case of FIG. 2 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 2, the horizontal axis of FIG. 10 represents ion mass, and the mass 1 peak, the mass 2 peak, and the mass 3 peak correspond to $H^+$, $H_2^+$, and $H_3^+$, respectively. The vertical axis represents the intensity of a spectrum corresponding to the number of ions. It can be seen from FIG. 10 that the ratio between ion species in plasma, i.e., the ratio between $H^+$, $H_2^+$, and $H_3^+$, is about 37:56:7. Note that, although FIG. 10 shows the data obtained when the source gas is $PH_3$, the ratio between the hydrogen ion species is about the same when a 100% hydrogen gas is used as a source gas, as well.

In the case of the ion source from which the data shown in FIG. 10 is obtained, $H_3^+$, of $H^+$, $H_2^+$, and $H_3^+$, is generated at a proportion of only about 7%. On the other hand, in the case of the ion source from which the data shown in FIG. 2 is obtained, the proportion of $H_3^+$ ions can be 50% or higher (under the aforementioned conditions, about 80%). This is thought to result from the pressure and the electric field inside a chamber, which is clearly shown in the above consideration.

($H_3^+$ Irradiation Mechanism)

When plasma that contains a plurality of ion species as shown in FIG. 2 is generated and a single crystal semiconductor substrate is irradiated with the generated ion species without any mass separation being performed, the surface of the single crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered: Model 1, where the ion species used for irradiation is $H^+$, which is still $H^+$ (H) after the irradiation; Model 2, where the ion species used for irradiation is $H_2^+$, which is still $H_2^+$ ($H_2$) after the irradiation; Model 3, where the ion species used for irradiation is $H_2^+$, which splits into two H atoms ($H^+$ ions) after the irradiation; Model 4, where the ion species used for irradiation is $H_3^+$, which is still $H_3^+$ ($H_3$) after the irradiation; and Model 5, where the ion species used for irradiation is $H_3^+$, which splits into three H atoms ($H^+$ ions) after the irradiation.

(Comparison of Calculation Results with Measured Values)

Based on the above models, the irradiation of a Si substrate with hydrogen ion species was calculated. As calculation software, SRIM, the Stopping and Range of Ions in Matter (an improved version of TRIM, the Transport of Ions in Matter, which is simulation software for ion introduction processes by a Monte Carlo method) was used. Note that, for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of a Si substrate changes into a non-single-crystal structure due to the collision of the hydrogen ion species with Si atoms.

Figure 4:
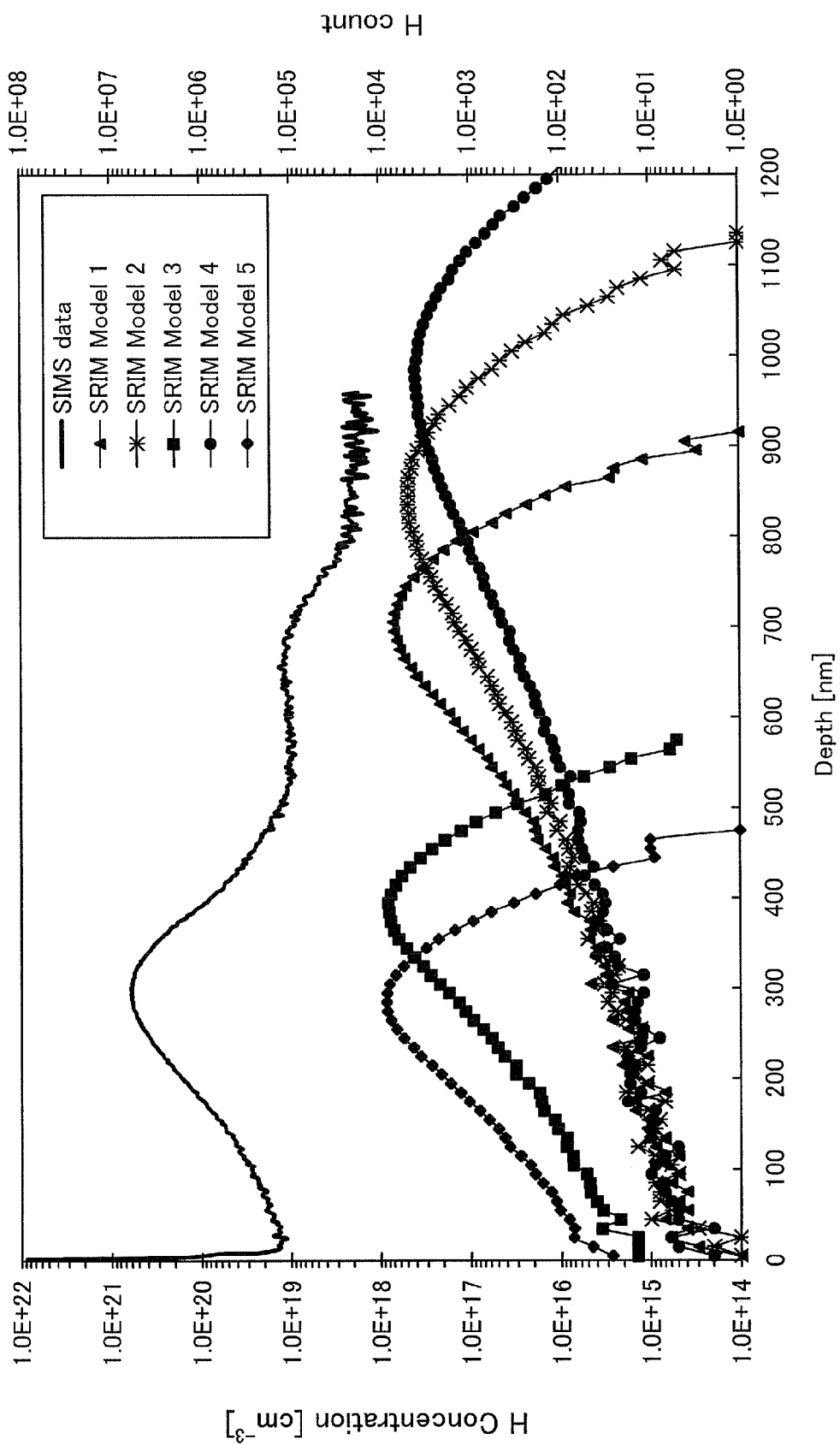
FIG. 4 is a diagram showing the profile (measured values and calculated values) of a hydrogen element in the depth direction when the accelerating voltage is 80 kV.

FIG. 4 shows the calculation results obtained when irradiation with the hydrogen ion species (irradiation with 100,000 atoms for H) is performed using Models 1 to 5. FIG. 4 also shows the hydrogen concentration (secondary ion mass spectrometry (SIMS) data) in a Si substrate irradiated with the hydrogen ion species of FIG. 2. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of a Si substrate. If the SIMS data, which is measured values, is compared with the calculation results, Models 2 and 4 clearly do not match the peaks of the SIMS data and a peak corresponding to Model 3 cannot be observed in the SIMS data. This shows that the contribution of each of Models 2 to 4 is relatively small. Considering that the unit of the kinetic energy of ions is kiloelectron volts whereas the H—H bond energy is only about several electron volts, the small contribution of each of Models 2 and 4 is probably because $H_2^+$ and $H_3^+$ mostly split into $H^+$ or H by colliding with Si atoms.

Figure 11:
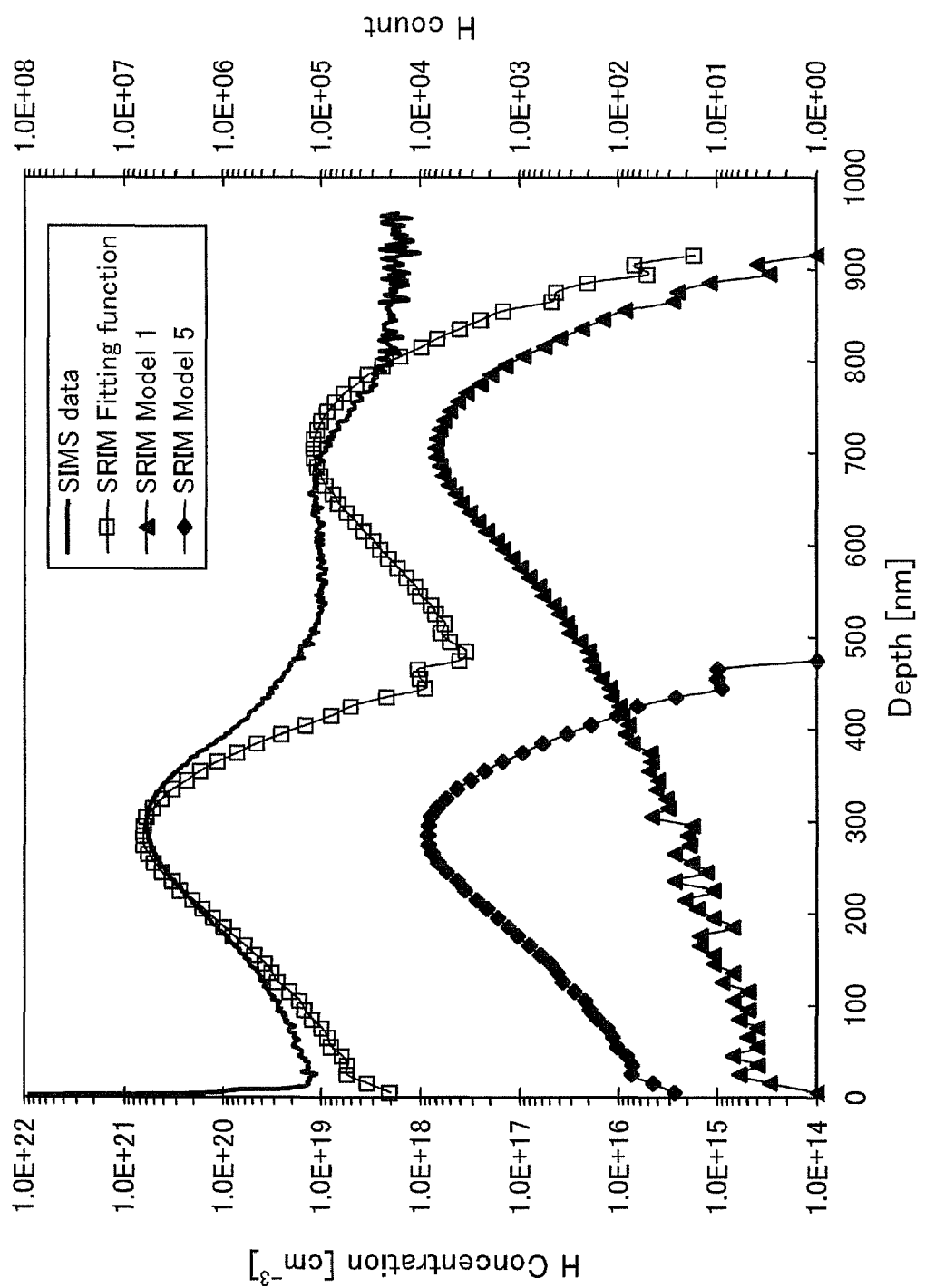
FIG. 11 is a diagram showing the profile (measured values, calculated values, and fitting function) of a hydrogen element in the depth direction when the accelerating voltage is 80 kV.
Figure 12:
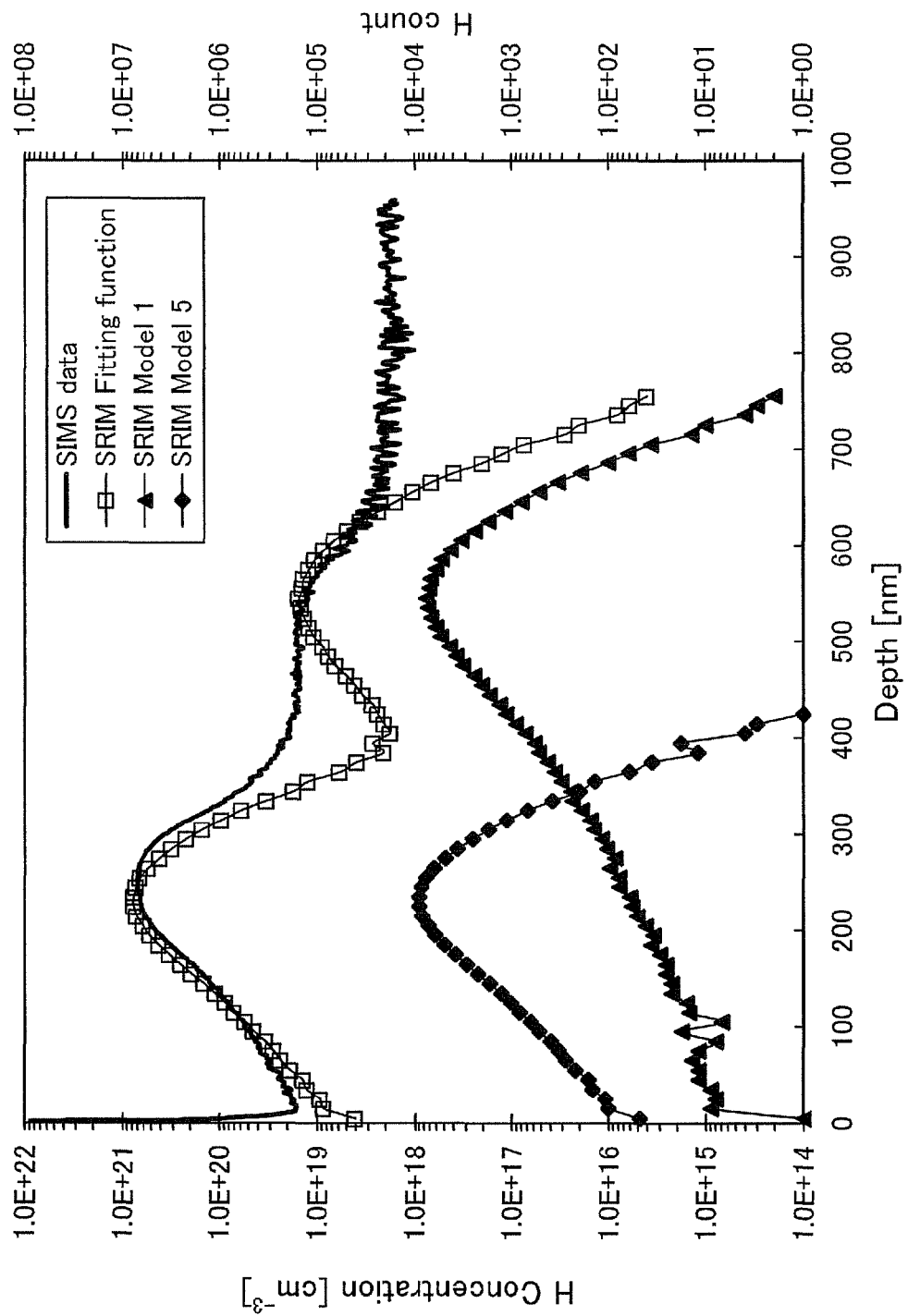
FIG. 12 is a diagram showing the profile (measured values, calculated values, and fitting function) of a hydrogen element in the depth direction when the accelerating voltage is 60 kV.
Figure 13:
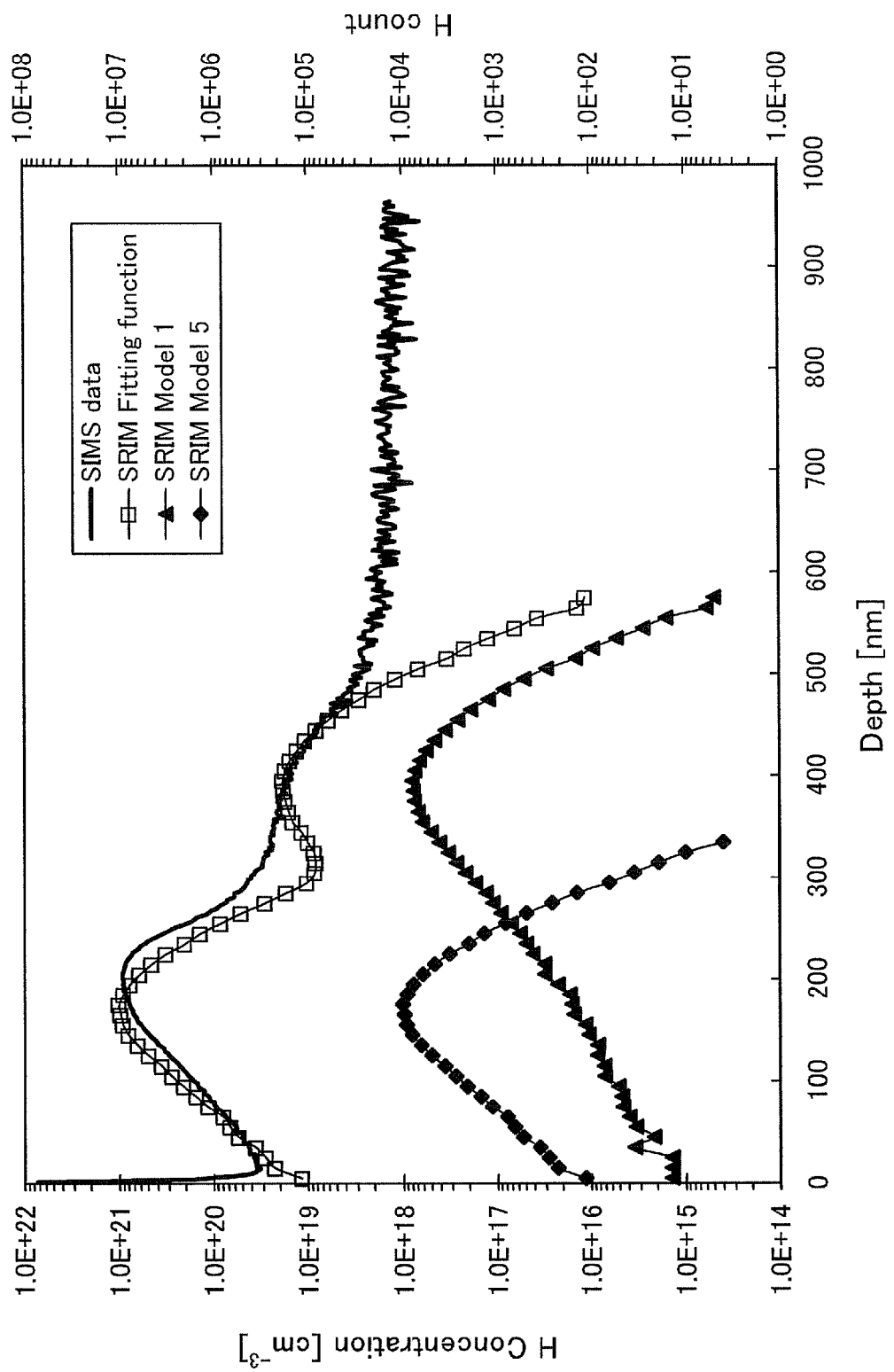
FIG. 13 is a diagram illustrating the profile (measured values, calculated values, and fitting functions) of a hydrogen element in the depth direction when the accelerating voltage is 40 kV.

Accordingly, Models 2 to 4 will not be considered hereinafter. FIGS. 11 to 13 each show the calculation results obtained when irradiation with the hydrogen ion species (irradiation with 100,000 atoms for H) is performed using Models 1 and 5. FIGS. 11 to 13 each also show the hydrogen concentration (SIMS data) in a Si substrate irradiated with the hydrogen ion species of FIG. 2, and the calculation results fitted to the SIMS data (hereinafter referred to as a fitting function). Here, FIG. 11 illustrates the case where the accelerating voltage is 80 kV; FIG. 12, the case where the accelerating voltage is 60 kV; and FIG. 13, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of a Si substrate.

The fitting function is obtained using the calculation formula given below, in consideration of Models 1 and 5. Note that, in the calculation formula, X and Y represent fitting parameters and V represents volume.

$$(\text{Fitting Function}) = X/V \times (\text{Data of Model 1}) + Y/V \times (\text{Data of Model 5})$$

In consideration of the ratio between ion species used for actual irradiation ($H^+:H_2^+:H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this calculation assumes amorphous Si and the influence due to crystallinity is not considered.

FIG. 14 lists the above-described fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not taken into consideration and the calculation assumes amorphous Si, it can be said that values close to that of the ratio between ion species used for actual irradiation ($H^+:H_2^+:H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 2. For example, because $H_3^+$ splits into $H^+$, H, or the like to be introduced into a substrate, ion introduction efficiency can be improved compared with the case of irradiation mainly with $H^+$ or $H_2^+$. This leads to an improvement in productivity of a semiconductor substrate. In addition, because the kinetic energy of $H^+$ or H after $H_3^+$ splits similarly tends to be low, $H_3^+$ is suitable for manufacture of thin semiconductor layers.

Note that, in this specification, a method is described in which an ion doping apparatus that is capable of irradiation with the hydrogen ion species as shown in FIG. 2 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in productivity can be obtained.

Embodiment Mode 2

Figure 5:
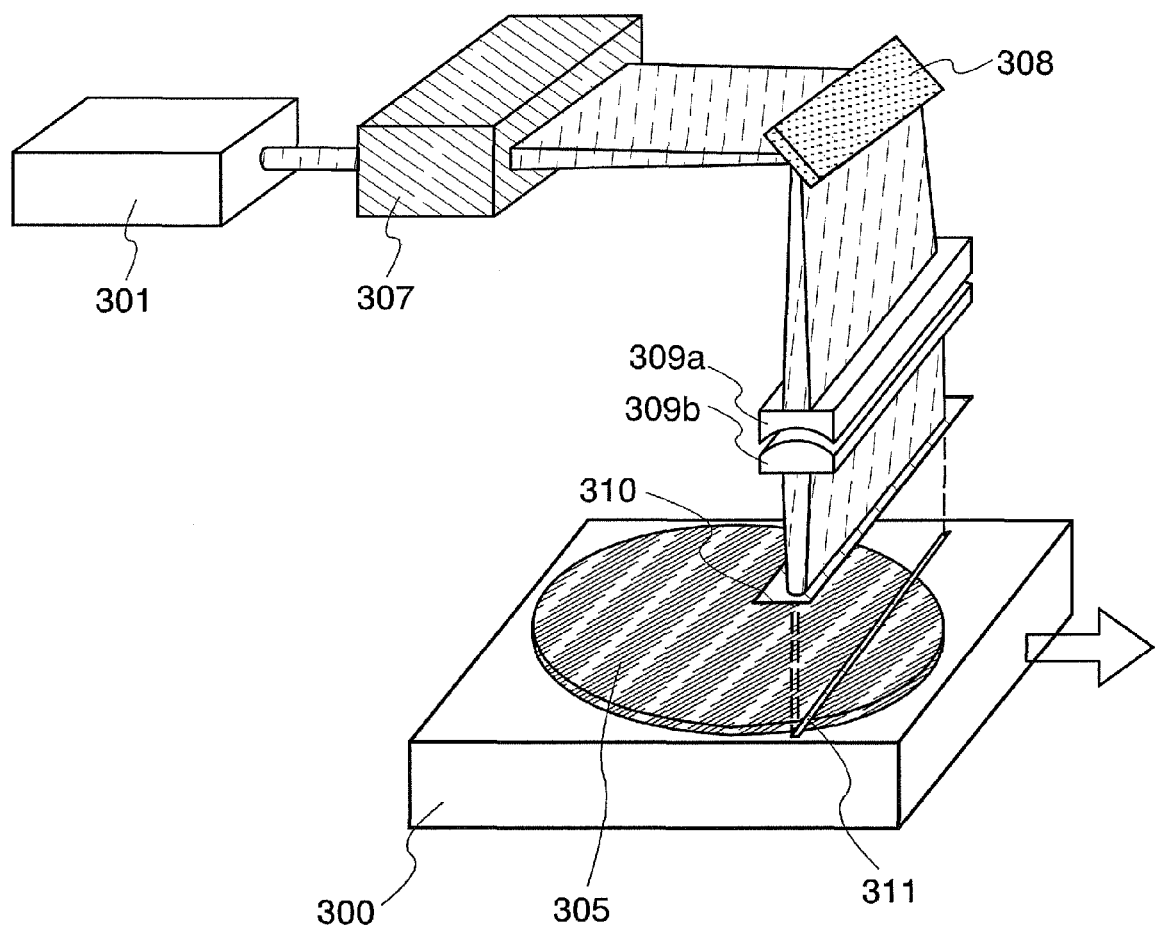
FIG. 5 is a perspective view which shows a state of laser beam irradiation.

In this embodiment mode, an example of a perspective view of a manufacturing apparatus, in which a stage of a substrate on a rear side can be heated to perform laser irradiation and a large-diameter wafer can be processed, is shown in FIG. 5.

The manufacturing apparatus is an apparatus in which, in order to reduce the processing time of laser beam irradiation, the length of a laser beam irradiation region 311 at a time is increased and a large-diameter wafer 305 is moved in one direction, whereby laser beam irradiation is completed. The large-diameter wafer 305 refers to a state shown in FIG. 1D described in Embodiment Mode 1 and is an SOI substrate having a buffer layer over a semiconductor wafer and a single crystal semiconductor layer over the buffer layer.

Note that a stage 300 and the large-diameter wafer 305 are arranged in a chamber to perform laser irradiation in the nitrogen atmosphere. The chamber is formed of a material with rigidity such as aluminum or stainless steel, the inner wall thereof has a mirror-like finish, and a heater for baking is provided to reduce discharge of a gas from the inner wall so that the inside of the chamber is evacuated to vacuum. As an exhaust means for vacuum evacuation, a butterfly valve, a conductance valve, a turbomolecular pump, a dry pump, and the like are given. More preferably, a cryopump is used together to reduce the oxygen concentration or the moisture concentration of a nitrogen atmosphere in the chamber. In addition, a high-purity nitrogen gas is used as a gas to be introduced into the chamber. An ultrapure gas in which the oxygen concentration included in the nitrogen gas is 30 ppb or less and the moisture concentration included in the nitrogen gas is 30 ppb or less is used, whereby the formation of an oxide film in laser irradiation is prevented.

Note that, for simplification, the chamber, the means for introduction of a nitrogen gas, the exhaust means, and the like are not illustrated in FIG. 5. The chamber is provided with a quartz window 310, and the manufacturing apparatus introduces a laser beam from the outside of the chamber through this quartz window 310.

Before scanning a laser beam, the large-diameter wafer 305 is heated by a heating means included in the stage 300, and the laser beam irradiation region 311 can be heated in advance; therefore, the energy of the laser beam that is needed for melting a single crystal semiconductor layer can be reduced. An irradiation area with one shot can be enlarged by adjusting an optical system or the like. If the irradiated area with one shot can be enlarged, the period of time for a laser beam irradiation process per one piece can be reduced. Here, by making best use of the energy which can be output from a laser 301, the length L of the laser beam irradiation region is increased.

As shown in FIG. 5, the length of the laser beam irradiation region is longer than a diameter of the large-diameter wafer 305. The diameter of the large-diameter wafer 305 is about 300 mm, about 400 mm, about 450 mm, or 450 mm or more, for example. As long as the size of the large-diameter wafer 305 is set such that the large-diameter wafer 305 can be put on the stage 300, the manufacturing apparatus shown in FIG. 5 can irradiate wafers with various diameters and improve planarity and crystallinity if the optical system is adjusted. In addition, a wafer shape is not limited to a circle, and the manufacturing apparatus shown in FIG. 5 can correspond to a rectangular wafer, a square wafer, or a polygonal wafer, for example.

The laser irradiation means shown in FIG. 5 has the laser 301, an optical device 307 in which a homogenizer is incorporated, an epi illumination mirror 308, and doublet lenses 309a and 309b. Note that to uniform energy distribution of a laser beam is referred to as "homogenize", and an optical system for homogenization is referred to as a "homogenizer". A laser beam emitted by the laser 301 is magnified by a spherical lens. Note that the spherical lens is not necessary in the case where a spot of the beam delivered from the laser 301 is sufficiently broad. Subsequently, the spot is split in a long-side (long-axis) direction of a linear shape by a cylindrical lens array. After that, the split laser beam is combined into a linear beam on the large-diameter wafer 305 by a cylindrical lens provided behind the cylindrical lens array. The large-diameter wafer 305 is irradiated with a linear laser beam that is synthesized. Accordingly, energy distribution of the spot of the linear beam in a long side direction is homogenized (long-axis homogenization) on the surface of the large-diameter wafer 305, so that the length of the laser beam irradiation region 311 (a length in the long-side direction) is determined.

Note that the example in which the stage is heated is illustrated in FIG. 5; however, there is no particular limitation, and the large-diameter wafer may be heated from a rear side by using a light-transmitting stage and a lamp such as a halogen lamp or the like. Alternatively, the inner wall of the chamber may be heated to increase the temperature in the nitrogen atmosphere, whereby the large-diameter wafer may be heated. Alternatively, by spraying a heated nitrogen gas, a blow means that selectively heats a laser beam irradiation region in advance may be provided. Further alternatively, a device may have a structure in which a laser beam is delivered in a state that a heated gas is sprayed on the large-diameter wafer from the rear side to float the large-diameter wafer and the heated gas is also sprayed from the front side to heat the large-diameter wafer.

Although the nitrogen atmosphere using a nitrogen gas that can be obtained at a low price is used as an example here, laser irradiation may be performed under a noble gas atmosphere or a mixed atmosphere of a noble gas and nitrogen. By using a noble gas such as argon, xenon, or the like, an atmosphere which does not react to a wafer material melted by laser irradiation can be made.

Embodiment Mode 3

In this embodiment mode, a method for manufacturing the semiconductor device using the SOI substrate formed in Embodiment Mode 1 will be described. Here, an example in which a CMOS structure is formed as a semiconductor device is shown with reference to FIGS. 6A to 6E. Note that the same portions as in FIGS. 1A to 1E are denoted by the same reference numerals for description in FIGS. 6A to 6E.

According to Embodiment Mode 1, the single crystal semiconductor layer 124 of an SOI substrate can have a thickness of 100 nm or less. When the single crystal semiconductor layer 124 has a thickness of 100 nm or less, it is thinner than the maximum depth of a depletion layer in a channel formation region of a transistor, and outstanding electrical characteristics of the transistor are brought about. The layer of the transistor is depleted sufficiently, whereby near ideal sub-threshold swing, threshold voltage, or the like can be obtained. Further, when a CMOS structure is formed, fast switching speed can be obtained.

Figure 6A:
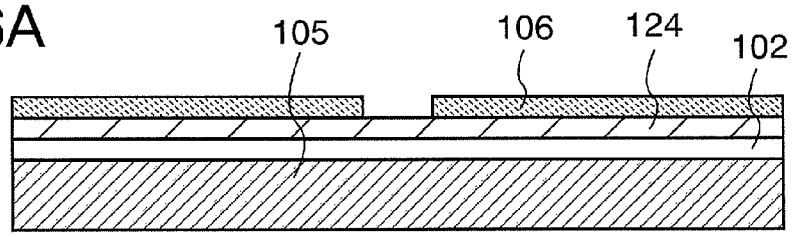
FIGS. 6A to 6E are cross-sectional views of a manufacturing process of a thin film transistor.

First, after an SOI substrate is obtained in accordance with Embodiment Mode 1, a protective layer 106 that serves as a mask for formation of an element isolation insulating layer is formed over the single crystal semiconductor layer 124. A process cross-sectional view in this step is shown in FIG. 6A. As the protective layer 106, a silicon oxide film, a silicon nitride film, or the like is used.

Note that it is preferable that p-type impurities such as boron, aluminum, gallium, or the like be added to the single crystal semiconductor layer 124 to control threshold voltage. For example, boron may be added as a p-type impurity at a concentration of greater than or equal to $5 \times 10^{17}$ cm$^{-3}$ and less than or equal to $1 \times 10^{18}$ cm$^{-3}$.

Figure 6B:
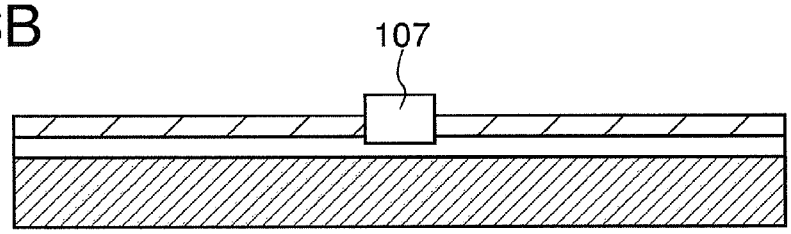

Next, etching is performed using the protective layer 106 as a mask, and parts of the exposed single crystal semiconductor layer 124 and the buffer layer 102 thereunder are removed. Next, a silicon oxide film is formed by a chemical vapor deposition method using TEOS. This silicon oxide film is formed thick so that the single crystal semiconductor layer 124 is embedded. Next, after the silicon oxide film overlapped with the single crystal semiconductor layer 124 is removed by polishing, the protective layer 106 is removed, and an element isolation insulating layer 107 remains. A process cross-sectional view in this step is shown in FIG. 6B.

Next, a first insulating film is formed, a gate electrode 109 having a polysilicon film that contains a conductive material is formed over the first insulating film, and the first insulating film is etched using the gate electrode as a mask to form a gate insulating layer 108. The gate insulating layer 108 is a single layer of a film including silicon oxide, silicon nitride oxide, silicon nitride, hafnium oxide, aluminum oxide, or tantalum oxide obtained by using a PECVD method, a sputtering method, or the like; or a stacked layer of these films. The gate insulating layer 108 can be formed to have a thin film thickness of, for example, 20 nm to cover the surface of the single crystal semiconductor layer 124 by a PECVD method. Alternatively, the gate insulating layer 108 may be formed by oxidizing or nitriding the surface of the single crystal semiconductor layer 124 by high-density plasma treatment. High-density plasma treatment is performed by using, for example, a mixed gas of a noble gas such as He, Ar, Kr, or Xe; and oxygen, nitrogen oxide, ammonia, nitrogen, or hydrogen. When excitation of the plasma in this case is performed by a microwave, high-density plasma can be generated at a low electron temperature. The surface of the semiconductor film is oxidized or nitrided by oxygen radicals (OH radicals may be included) or nitrogen radicals (NH radicals may be included) which are generated by such high-density plasma, whereby an insulating film is formed to a thickness of 1 nm to 50 nm, desirably 5 nm to 30 nm so as to be in contact with the single crystal semiconductor layer 124. As described in Embodiment Mode 1, the surface of the single crystal semiconductor layer is sufficiently planarized by laser irradiation while heating is performed; therefore, even if an insulating film having a thickness of 20 nm is used as the gate insulating layer 108, sufficient gate withstand voltage can be obtained.

Figure 6C:
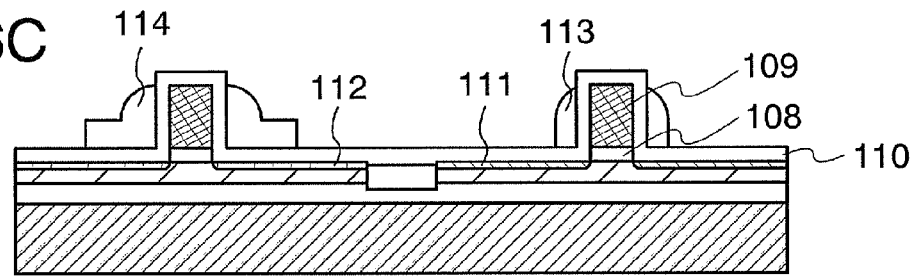

Next, a second insulating film 110 that covers the gate electrode 109 is formed, and sidewall insulating layers 113 and 114 are formed. The sidewall insulating layer 114 in a region to serve as a pFET has a wider width than the sidewall insulating layer 113 in a region to serve as an nFET. Next, the region to serve as the nFET is doped with As or the like to form a first impurity region 111 with a shallow junction depth, and the region to serve as the pFET is doped with B or the like to form a second impurity region 112 with a shallow junction depth. A process cross-sectional view in this step is shown in FIG. 6C.

Figure 6D:
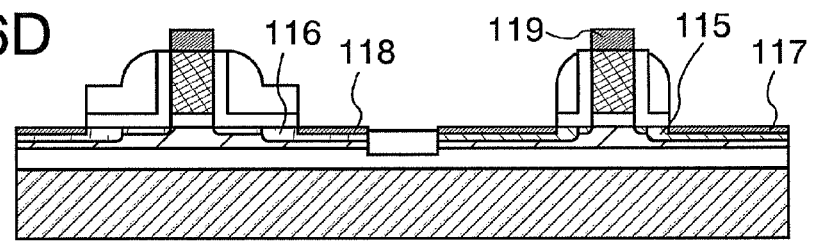

Next, the second insulating film 110 is partly etched, and the top surface of the gate electrode 109, the first impurity region 111, and the second impurity region 112 are exposed. Next, the region to serve as the nFET is doped with As or the like to form a third impurity region 115 with a deep junction depth, and the region to serve as the pFET is doped with B or the like to form a fourth impurity region 116 with a deep junction depth. Next, heat treatment (800° C. to 1100° C.) for activation is performed. Then, a cobalt film is formed as a metal film for forming silicide. Next, heat treatment (500° C. for one minute) such as RTA or the like is performed, and silicon in a portion that is in contact with the cobalt film is silicidized. As a result, a silicide portion 119 is formed over the gate electrode 109, a silicide portion 117 is formed over the third impurity region 115, and a silicide portion 118 is formed over the fourth impurity region 116. Then, the cobalt film is removed selectively. Next, heat treatment is performed at a temperature that is higher than that of heat treatment for silicidizing, and lower resistance of the silicide portions 117, 118, and 119 is achieved. A process cross-sectional view in this step is shown in FIG. 6D.

Figure 6E:
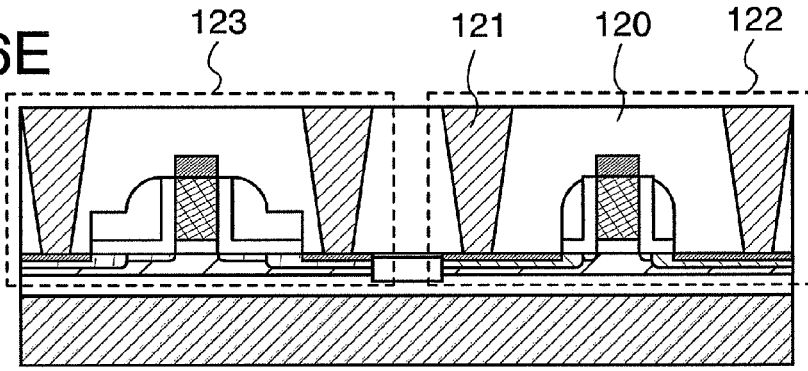

Next, an interlayer insulating film 120 is formed, and contact plugs 121 to be electrically connected to the third impurity region 115 with a deep junction depth and the fourth impurity region 116 with a deep junction depth are formed. In this way, an nFET 122 and a pFET 123 can be formed using the single crystal semiconductor layer 124 bonded to the second semiconductor wafer 105. A process cross-sectional view in this step is shown in FIG. 6E.

A CMOS structure is formed by combining the nFET 122 and the pFET 123 complementarily.

Over this CMOS structure, a semiconductor device such as a microprocessor or the like can be formed by stacking a wiring, an element, or the like. The microprocessor includes an arithmetic logic unit (also referred to as ALU), an ALU controller, an instruction decoder, an interrupt controller, a timing controller, a register, a register controller, a bus interface (Bus I/F), a read only memory, and a memory interface (ROM I/F).

The microprocessor is provided with an integrated circuit having a CMOS structure; therefore, not only high processing speed but also lower power consumption can be achieved.

Embodiment Mode 4

Figure 7:
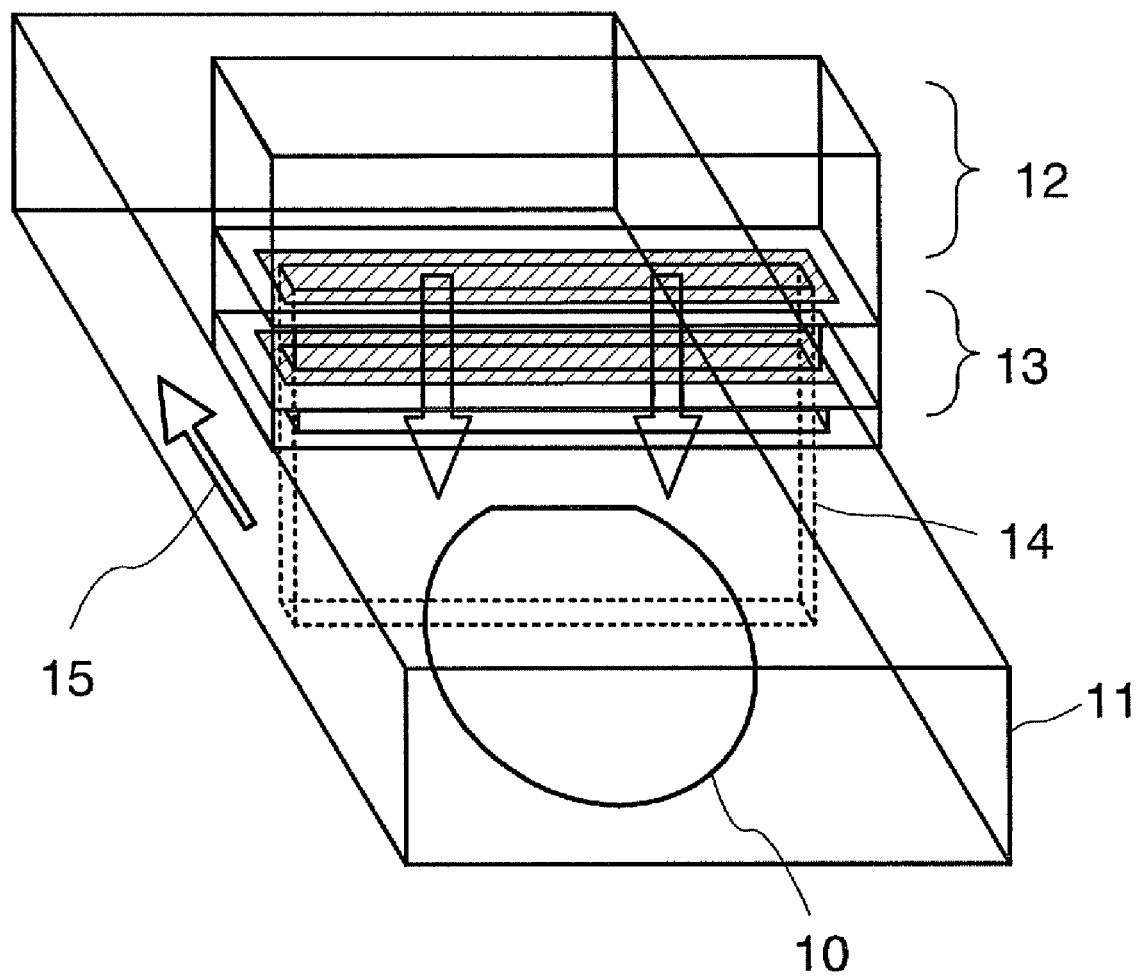
FIG. 7 is a diagram which shows an example of an ion doping apparatus.

In Embodiment Mode 1, an example of using a doping apparatus which rotates a semiconductor wafer is taken for example; however, in this embodiment mode, an example of a doping apparatus for making the form of ion flow into a desired form, and transferring a semiconductor wafer will be shown. FIG. 7 is a perspective view illustrating an example of such a doping apparatus.

An ion source 12 includes a filament for emitting thermoelectrons which is provided in a chamber which is a plasma chamber and a plurality of permanent magnet rings arranged around the chamber so that the polarities are alternated.

Further, an accelerating electrode portion 13 includes an ion trap electrode of which potential is maintained at the same potential as the chamber, which is an anode, an extraction electrode of which potential is maintained at a potential lower than the potential of the ion trap electrode by several kV, and an accelerating electrode of which potential is maintained at a potential lower than the potential of the extraction electrode by several kV at the bottom opening of the chamber. Note that the ion trap electrode, the extraction electrode, and the accelerating electrode are grid electrodes.

Further, ON/OFF of irradiation may be controlled by open/close operation of a shutter provided for blocking an ion beam.

Electrons emitted from the filament is applied to a working gas (hydrogen, phosphine, diborane, or the like) introduced into the chamber from a gas inlet to generate plasma; while the plasma is confined in the chamber with the magnetic field of the permanent magnet, the electric field is applied by the extraction electrode to extract ions in the plasma through the ion trap electrode, and the ions are accelerated by the electric field of the accelerating electrode to generate an ion beam 14.

Then, the inside of a doping chamber 11 is irradiated with the ion beam 14 and the semiconductor wafer 10 is irradiated with ions. The plane of the semiconductor wafer is kept in the direction perpendicular to the direction of irradiation with the ion beam 14. Doping treatment of the entire surface of the semiconductor wafer is performed under the conditions where the shape of a plane irradiated with the ion beam 14 is elongated linear or elongated oblong by transferring the semiconductor wafer in the direction perpendicular to the longitudinal direction of the plane irradiated with the ion beam 14.

Further, when the shape of the plane irradiated with the ion beam 14 is elongated linear or elongated oblong, variation in the concentration of ions implanted into the semiconductor wafer can be reduced as compared with the case of performing raster scan (also referred to as dot sequential scan).

The semiconductor wafer 10 is moved in a scan direction 15 to pass under the ion source 12 using a wafer transfer robot. The semiconductor wafer 10 may be moved in the scan direction with the use of a rail and a driver geared motor without limitation to a robot.

Further, the entire surface of the semiconductor wafer 10 can be irradiated by one time transfer in the scan direction 15 which is a straight line direction; therefore, irradiation of the entire surface of the semiconductor wafer can be completed in a shorter time than the case of performing raster scan.

Further, without limitation to the above apparatus structure in FIG. 7, an apparatus may have a structure in which irradiation with an ion beam is performed in the horizontal direction with the substrate in a state of inclination, which is made almost vertical because particles issue.

This embodiment mode can be freely combined with any one of Embodiment Modes 1 to 3. For example, the ion doping apparatus shown in FIG. 7 and the manufacturing apparatus which processes a semiconductor wafer in one direction shown in FIG. 5 are arranged in line with various apparatus interposed therebetween, whereby a manufacturing apparatus of an inline system can be made.

Embodiment Mode 5

In Embodiment Mode 1, the example in which the same single crystal silicon wafers are bonded to each other is shown; however, a single crystal silicon wafer having a diameter of about 450 mm is used as a semiconductor wafer 401 here. In addition, as a bonded semiconductor wafer, a polycrystalline silicon wafer 405 having a diameter of about 450 mm is used as an example. The thickness of the polycrystalline silicon wafer is 825 μm.

Figure 8A:
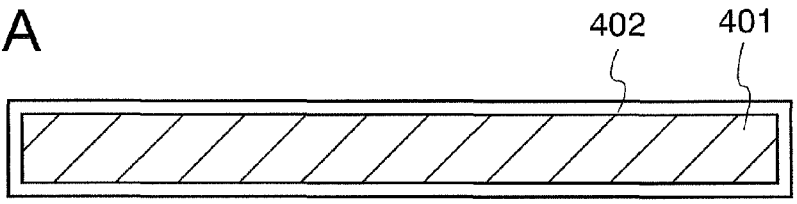
FIGS. 8A to 8E are diagrams illustrating a manufacturing process of a semiconductor substrate.

First, a thermal oxide film 402 that is an oxide film obtained by thermal oxidation in which a gas containing a halogen is added to the oxidative atmosphere is formed as one layer of a buffer layer on the surface of the semiconductor wafer 401. A cross-sectional view in this step is shown in FIG. 8A.

As a gas containing a halogen, one or more kinds of gases selected from HCl, HF, $NF_3$, HBr, $Cl_2$, $ClF_3$, $BCl_3$, $F_2$, $Br_2$, and the like can be used. For example, thermal treatment is carried out in an atmosphere containing HCL at a ratio of 0.5 volume % to 10 volume % (preferably, 3 volume %) with respect to oxygen at a temperature of 700° C. or higher. Thermal oxidation may be performed at heating temperature of higher than or equal to 950° C. and lower than or equal to 1100° C. Processing time may be 0.1 to 6 hours, preferably 0.5 to 1 hour. The thickness of the thermal oxide film 402 to be formed is 10 nm to 1000 nm (preferably, 50 nm to 200 nm), and for example, the thickness can be 100 nm. In this embodiment mode, the thermal oxide film 402 has a thickness of 50 nm.

Through the oxidation treatment performed within such a temperature range, a gettering effect by a halogen element can be obtained. Gettering particularly has an effect of removing a metal impurity. That is, with action of chlorine, an impurity such as metal turns into a volatile chloride and is released into air, thereby being removed from the semiconductor wafer 401. In addition, a dangling bond on the surface of the semiconductor wafer 401 is terminated by a halogen element included in oxidation treatment, whereby the local level density at the interface between the thermal oxide film 402 and the semiconductor wafer 401 can be reduced. By this thermal oxidation treatment in the atmosphere containing a halogen, the halogen can be contained in the oxide film. The halogen element is contained at a concentration of $1\times10^{17}$ atoms/cm$^3$ to $5\times10^{20}$ atoms/cm$^3$, so that the semiconductor wafer 401 can function as a protective film which captures an impurity such as metal or the like and prevents contamination of the single crystal semiconductor layer 104.

A halogen can be contained in the buffer layer by formation of an insulating film in a chamber of a PECVD apparatus that contains a fluoride gas or a fluorine gas. A process gas for formation of an insulating film is introduced into such a chamber and excited to generate plasma, whereby the buffer layer is formed on the semiconductor wafer 401 by chemical reaction of active species included in the plasma. A fluorine compound gas can be included in the chamber of the PECVD apparatus by cleaning the chamber by plasma gas etching using a fluoride gas. When a film is formed by the PECVD apparatus, a product which is formed of a material reacted is deposited not only on a substrate surface but also an inner wall of the chamber, an electrode, a substrate holder, or the like. This deposit causes particles and dust. Therefore, a cleaning step of removing such a deposit is performed regularly. As one of typical cleaning methods of the chamber, there is a method by plasma gas etching, by which a fluoride gas such as $NF_3$ or the like is introduced into the chamber and excited into plasma, so that fluorine radicals are generated and the deposit is etched to be removed. Because the fluoride which is generated by reaction with the fluorine radicals has high vapor pressure, the fluoride is removed from a reaction container by an exhaust system. Cleaning is performed by plasma gas etching, whereby the fluoride gas used as a cleaning gas is adsorbed by the inner wall of the chamber, the electrode included in the chamber, and various jigs. That is, a fluoride gas can be included in the chamber. Note that as a method by which the fluoride gas is included in the chamber, a method by which the semiconductor wafer 401 is set in the chamber and then the fluoride gas is introduced into the chamber can be employed as well as a method by which the chamber is cleaned with the fluoride gas to make the fluoride gas remain in the chamber.

Figure 8B:
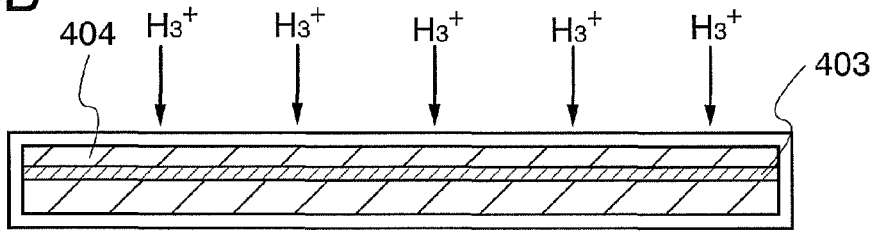

Next, the semiconductor wafer 401 is doped with hydrogen ions by using an ion doping apparatus. A 100% hydrogen gas is used as a source gas, and without mass separation of ions in plasma that are generated by excitation of the hydrogen gas, the semiconductor wafer 401 is irradiated with the ions accelerated by an electric field, whereby a damaged region 403 is formed. A cross-sectional view in this step is shown in FIG. 8B. This doping condition is set as follows: the power outlet is 100 W, the accelerating voltage is 25 kV, and the dose is $2.2\times10^{16}$ ions/cm$^2$. In addition, a single crystal semiconductor layer 404 is formed between the damaged region 403 and the thermal oxide film 402 which is one layer of the buffer layer.

Next, the semiconductor wafer 401 provided with the thermal oxide film 402 is subjected to ultrasonic cleaning in pure water.

The polycrystalline silicon wafer 405 to be bonded to the semiconductor wafer 401 later is similarly subjected to thermal oxidation to form a thermal oxide film 406 which is an oxide film. Next, the polycrystalline silicon wafer 405 provided with the thermal oxide film 406 is subjected to ultrasonic cleaning in pure water.

Then, one or both of the semiconductor wafer 401 and the polycrystalline silicon wafer 405 is/are provided with an insulating film 407 to serve as one layer of the buffer layer. As the insulating film 407, a silicon nitride oxide film, a silicon oxynitride film, or a silicon nitride film is formed by a PECVD method. Here, as the insulating film 407, a silicon nitride oxide film having a thickness of 50 nm is formed over the polycrystalline silicon wafer 405 by a PECVD method.

Figure 8C:
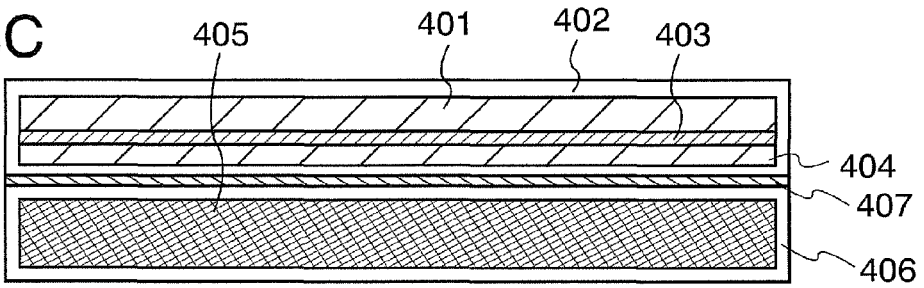

Next, the semiconductor wafer 401 and the polycrystalline silicon wafer 405 are overlapped with and bonded to each other to form a bond. A cross-sectional view in this step is shown in FIG. 8C.

Figure 8D:
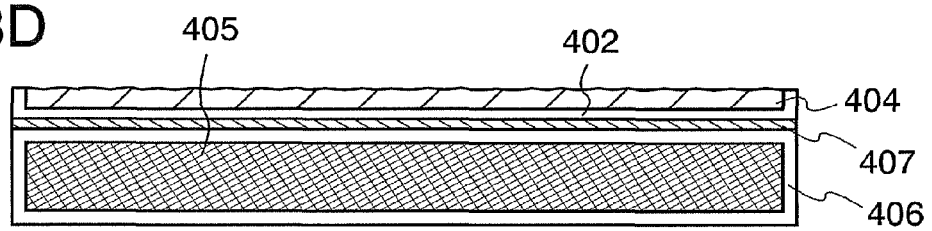

Then, to cause cleavage in the damaged region 403, heating is performed at 600° C. in a diffusion furnace, whereby the semiconductor wafer 401 is cleaved to separate the single crystal semiconductor layer 404 from the single crystal silicon wafer. A cross-sectional view in this step is shown in FIG. 8D.

Next, heat treatment is performed at higher than or equal to 500° C. and lower than or equal to 1100° C. In order to eliminate a defect of the single crystal semiconductor layer 404, to ease the distortion of the single crystal semiconductor layer 404, and to improve planarity, CMP is performed, so that an SOI substrate can be formed. It is preferable that a step of processing a peripheral portion of the SOI substrate be added so that the SOI substrate can be set for a manufacturing apparatus of a semiconductor device in a similar way to the semiconductor wafer.

Figure 8E:
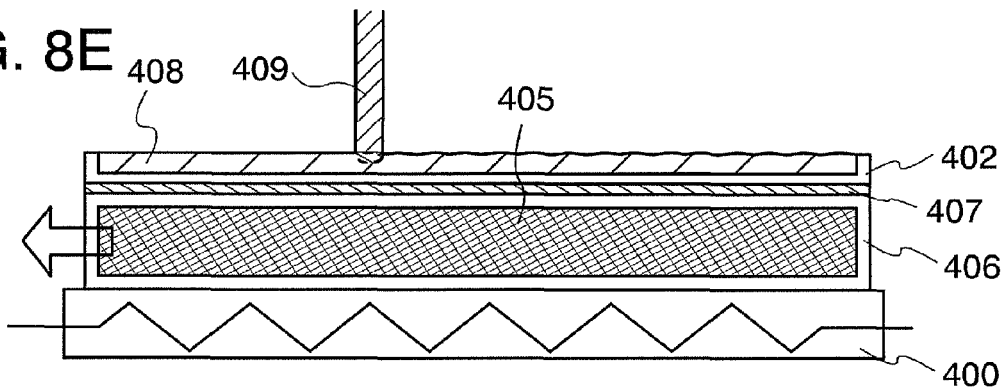

The manufacture of the SOI substrate may be completed in this manner. However, in this embodiment mode, planarity is improved by irradiation with a laser beam after a step of FIG. 8D, and then heat treatment is performed at higher than or equal to 500° C. and lower than or equal to 1100° C. to form an SOI substrate, as shown in FIG. 8E. When a laser beam is delivered, planarity can be improved and crystallinity can be recovered, and a single crystal semiconductor layer 408 with excellent planarity and excellent crystallinity can be obtained. Because the polycrystalline silicon wafer 405 used in this embodiment mode has a large diameter of about 450 mm, it is preferable that a stage 400 be heated and the energy of the laser beam that is needed for melting of the single crystal semiconductor layer be reduced so that a laser beam 409 is delivered. When the single crystal semiconductor layer 404 is heated at 500° C. to 1100° C. in laser irradiation, by making best use of the energy which can be output from a laser, the length of a laser beam irradiation region can be set longer than the diameter of the polycrystalline silicon wafer 405. The period of time for heat treatment after laser irradiation can be reduced compared with the case where a laser beam is not delivered while heating is performed. Needless to say, when a laser beam is delivered, a step of processing the peripheral portion of the SOI substrate is added so that the SOI substrate can be set for a manufacturing apparatus of a semiconductor device in a similar way to the semiconductor wafer.

Note that it is preferable to perform an etching process before irradiation with the laser beam 409. It is also preferable to remove the damaged region 403 left on the separation plane of the single crystal semiconductor layer 404 by this etching process. By removing the damaged region 403, an effect of planarization of a surface and an effect of re-single-crystallization can be increased by irradiation with the laser beam 409.

The example in which the buffer layer has a three-layer structure of the thermal oxide film 402, the insulating film 407, and the thermal oxide film 406 in this embodiment mode; however, there is no particular limitation and the buffer layer described in Embodiment Mode 1 can be used.

This embodiment mode can be freely combined with any one of Embodiment Modes 1 to 4.

In the following embodiment, more detailed description is made on the structure of the present invention.

Embodiment 1

Although Embodiment Mode 3 describes the method for manufacturing a TFT as an example of a method for manufacturing a semiconductor device, a semiconductor device can be manufactured so as to have high added value by forming a variety of semiconductor elements such as a capacitor and a resistor together with the TFT for a substrate with a semiconductor film. This embodiment will describe specific modes of semiconductor devices with reference to drawings.

Figure 9:
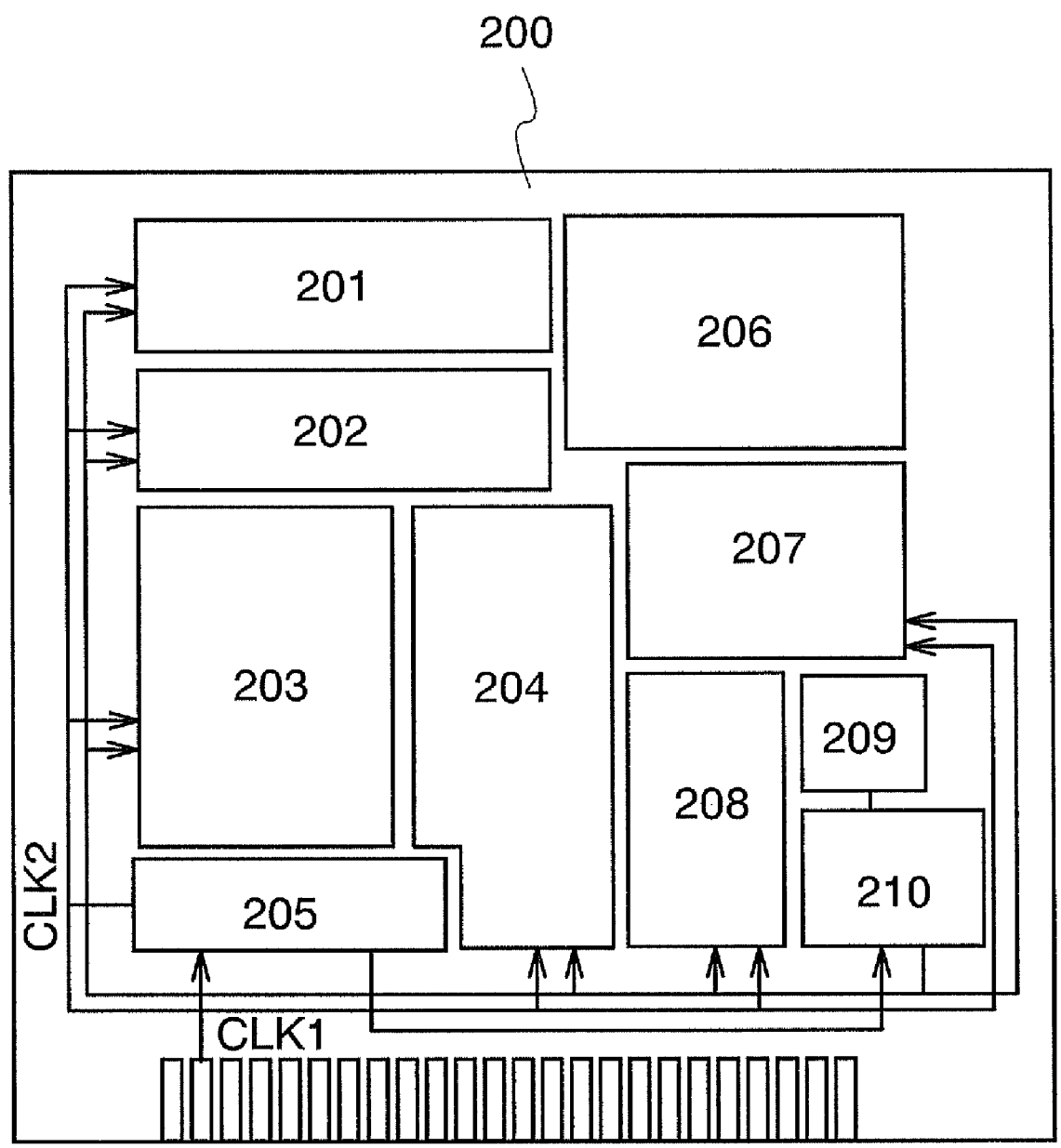
FIG. 9 is a block diagram which shows an example of a structure of a microprocessor.

First, a microprocessor will be described as an example of a semiconductor device. FIG. 9 is a block diagram showing a structural example of a microprocessor 200.

This microprocessor 200 includes an arithmetic logic unit (also referred to as ALU) 201, an ALU controller 202, an instruction decoder 203, an interrupt controller 204, a timing controller 205, a register 206, a register controller 207, a bus interface (Bus I/F) 208, a read only memory (ROM) 209, and a memory interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 perform various controls based on the decoded instruction.

The ALU controller 202 generates signals for controlling the operation of the ALU 201. While the microprocessor 200 executes a program, the interrupt controller 204 processes an interrupt request from an external input/output device or a peripheral circuit based on its priority or a mask state, and processes the interrupt request. The register controller 207 generates an address of the register 206, and reads and writes data from and to the register 206 in accordance with the state of the microprocessor 200. The timing controller 205 generates signals for controlling when to drive the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1. As shown in FIG. 9, the internal clock signal CLK2 is input to another circuit.

The microprocessor shown in FIG. 9 is formed using the SOI substrate described in Embodiment Mode 1 or Embodiment Mode 5, and the microprocessor is mounted, whereby various electric devices can be formed. The electronic devices include cameras such as a video camera and a digital camera, a navigation system, a sound reproduction system (such as a car audio system and an audio component), a computer, a game machine, a mobile information terminal (such as a mobile computer, a cellular phone, a mobile game machine, and an electronic book reader), an image reproduction device provided with a recording medium (specifically, digital versatile disc (DVD)), and the like.

This embodiment can be combined with any one of Embodiment Modes 1 to 5.

Even if a wafer has a large diameter, production time of an SOI substrate per one piece can be reduced, and a process most favorable to mass production can be provided.

This application is based on Japanese Patent Application serial no. 2007-285504 filed with Japan Patent Office on Nov. 1, 2007, the entire contents of which are hereby incorporated by reference.

What is claimed is:

1. A method for manufacturing a semiconductor substrate, comprising the steps of:
    forming a buffer layer over a first semiconductor substrate;
    forming a damaged region in the first semiconductor substrate by irradiating the first semiconductor substrate with ions;
    bonding the first semiconductor substrate and a second semiconductor substrate with the buffer layer interposed between;
    separating the first semiconductor substrate with a single crystal semiconductor layer left over the second semiconductor substrate by heating the first semiconductor substrate and the second semiconductor substrate; and
    re-single-crystallizing the single crystal semiconductor layer by irradiating with a laser beam and concurrently heating and melting the single crystal semiconductor layer.

2. The method for manufacturing a semiconductor substrate according to claim 1, wherein the single crystal semiconductor layer is melted by irradiating the single crystal semiconductor layer with the laser beam and heating the single crystal semiconductor layer.

3. The method for manufacturing a semiconductor substrate according to claim 1, wherein each of the first semiconductor substrate and the second semiconductor substrate is a single crystal semiconductor substrate.

4. The method for manufacturing a semiconductor substrate according to claim 1, wherein the first semiconductor substrate is a single crystal semiconductor substrate, and the second semiconductor substrate is a polycrystalline semiconductor substrate.

5. The method for manufacturing a semiconductor substrate according to claim 1, wherein the buffer layer includes an oxide film which is formed by oxidizing one of the first semiconductor substrate and the second semiconductor substrate.

6. The method for manufacturing a semiconductor substrate according to claim 1, wherein the buffer layer includes a silicon nitride film and a silicon nitride oxide film.

7. The method for manufacturing a semiconductor substrate according to claim 1, wherein the buffer layer includes an insulating film in contact with the single crystal semiconductor layer, and wherein the insulating film contains a halogen.

8. The method for manufacturing a semiconductor substrate according to claim 1, wherein heating temperature of the single crystal semiconductor layer at time of irradiation with the laser beam is higher than or equal to 500° C. and lower than or equal to 1100° C.

9. The method for manufacturing a semiconductor substrate according to claim 1, wherein a shape of a top surface of a region irradiated with the laser beam is one of a linear shape, a square, and a rectangle.

10. The method for manufacturing a semiconductor substrate according to claim 1, wherein a diameter of the second semiconductor substrate is 5 inches or more.

11. The method for manufacturing a semiconductor substrate according to claim 1, wherein the single crystal semiconductor layer is heated by a heating means.

12. The method for manufacturing a semiconductor substrate according to claim 11, wherein the heating means is selected from the group consisting of a stage, spraying a heated gas, and lamp irradiation.

13. A method for manufacturing a semiconductor substrate, comprising the steps of:
    forming a buffer layer over a first semiconductor substrate;
    forming a damaged region in the first semiconductor substrate by irradiating the first semiconductor substrate with $H_3^+$ ions by an ion doping method;
    bonding the first semiconductor substrate and a second semiconductor substrate with the buffer layer interposed between;
    separating the first semiconductor substrate with a single crystal semiconductor layer left over the second semiconductor substrate by heating the first semiconductor substrate and the second semiconductor substrate; and
    re-single-crystallizing the single crystal semiconductor layer by irradiating with a laser beam and concurrently heating and melting the single crystal semiconductor layer.

14. The method for manufacturing a semiconductor substrate according to claim 13, wherein the single crystal semiconductor layer is melted by irradiating the single crystal semiconductor layer with the laser beam and heating the single crystal semiconductor layer.

15. The method for manufacturing a semiconductor substrate according to claim 13, wherein each of the first semiconductor substrate and the second semiconductor substrate is a single crystal semiconductor substrate.

16. The method for manufacturing a semiconductor substrate according to claim 13, wherein the first semiconductor substrate is a single crystal semiconductor substrate, and the second semiconductor substrate is a polycrystalline semiconductor substrate.

17. The method for manufacturing a semiconductor substrate according to claim 13, wherein the buffer layer includes an oxide film which is formed by oxidizing one of the first semiconductor substrate and the second semiconductor substrate.

18. The method for manufacturing a semiconductor substrate according to claim 13, wherein the buffer layer includes a silicon nitride film and a silicon nitride oxide film.

19. The method for manufacturing a semiconductor substrate according to claim 13, wherein the buffer layer includes an insulating film in contact with the single crystal semiconductor layer, and wherein the insulating film contains a halogen.

20. The method for manufacturing a semiconductor substrate according to claim 13, wherein heating temperature of the single crystal semiconductor layer at time of irradiation with the laser beam is higher than or equal to 500° C. and lower than or equal to 1100° C.

21. The method for manufacturing a semiconductor substrate according to claim 13, wherein a shape of a top surface of a region irradiated with the laser beam is one of a linear shape, a square, and a rectangle.

22. The method for manufacturing a semiconductor substrate according to claim 13, wherein a diameter of the second semiconductor substrate is 5 inches or more.

23. The method for manufacturing a semiconductor substrate according to claim 13, wherein the single crystal semiconductor layer is heated by a heating means.

24. The method for manufacturing a semiconductor substrate according to claim 23, wherein the heating means is selected from the group consisting of a stage, spraying a heated gas, and lamp irradiation.

* * * * *